US00RE41747E

(19) United States
(12) Reissued Patent
Okura et al.

(10) Patent Number: US RE41,747 E
(45) Date of Reissued Patent: Sep. 21, 2010

(54) METAL FILM AND METAL FILM-COATED MEMBER, METAL OXIDE FILM AND METAL OXIDE FILM-COATED MEMBER, THIN FILM FORMING APPARATUS AND THIN FILM FORMING METHOD FOR PRODUCING METAL FILM AND METAL OXIDE FILM

(75) Inventors: Takahiro Okura, Ome (JP); Kazuya Shimizu, Ome (JP); Masakazu Takei, Ome (JP)

(73) Assignee: Kyocera Optec Co., Ltd., Tokyo (JP)

(21) Appl. No.: 11/877,631

(22) Filed: Oct. 23, 2007

Related U.S. Patent Documents

Reissue of:
(64) Patent No.: 7,033,679
Issued: Apr. 25, 2006
Appl. No.: 10/057,822
Filed: Jan. 24, 2002

(30) Foreign Application Priority Data

| | | |
|---|---|---|
| Jan. 25, 2001 | (JP) | 2001-016711 |
| Mar. 13, 2001 | (JP) | 2001-070653 |
| Mar. 13, 2001 | (JP) | 2001-070654 |
| Oct. 4, 2001 | (JP) | 2001-308558 |
| Oct. 4, 2001 | (JP) | 2001-308559 |

(51) Int. Cl.

| | |
|---|---|
| ***B32B 15/04*** | (2006.01) |
| ***B32B 15/20*** | (2006.01) |
| ***B32B 33/00*** | (2006.01) |
| ***G03B 21/28*** | (2006.01) |
| ***F21V 7/00*** | (2006.01) |

(52) U.S. Cl. ..... 428/687; 428/673; 428/220; 428/446; 428/650; 428/700; 362/296; 313/113; 353/98

(58) Field of Classification Search ..... 428/687, 428/673, 672, 220, 457, 700, 912.2, 650, 428/688, 446, 450; 362/296; 353/98; 427/459
See application file for complete search history.

(56) References Cited

U.S. PATENT DOCUMENTS

| | | | |
|---|---|---|---|
| 6,063,513 | A | 5/2000 | Tanino |
| 6,372,369 | B1 | 4/2002 | Ito et al. |
| 6,515,297 | B2 | 2/2003 | Takeda et al. |
| 6,562,183 | B1 | 5/2003 | Yamada et al. |

FOREIGN PATENT DOCUMENTS

| | | | | |
|---|---|---|---|---|
| JP | 57002003 | A | | 1/1982 |
| JP | 0148347 | A | | 10/1989 |
| JP | 03126697 | A | | 5/1991 |
| JP | 04017669 | A | | 1/1992 |
| JP | 05226335 | A | | 9/1993 |
| JP | 06216131 | A | | 8/1994 |
| JP | 06-216131 | | * | 8/1994 |
| JP | 06267954 | A | | 9/1994 |
| JP | 08003735 | A | | 1/1996 |
| JP | 08234004 | A | | 9/1996 |
| JP | 2001-016711 | | * | 1/2001 |
| JP | 2001-070653 | | * | 3/2001 |
| JP | 2001-070654 | | * | 3/2001 |
| JP | 2001-308558 | | * | 10/2001 |
| JP | 2001-308559 | | * | 10/2001 |

OTHER PUBLICATIONS

Japanese language office action and its English translation for corresponding Japanese application number 2001–308559 lists the reference above, (Jan. 2007).

* cited by examiner

*Primary Examiner*—Gwendolyn Blackwell
(74) *Attorney, Agent, or Firm*—Hogan Lovells US LLP

(57) ABSTRACT

The metal film of the present invention is a dense film of a single crystal that has very low surface roughness and very good crystal orientation because an arithmetic mean roughness of the surface is not larger than 2 nm and a (111) peak intensity of X-ray diffraction is not less than 20 times the sum of all other peaks. Also the metal oxide film of the present invention is a dense film that includes less oxygen defects and almost no voids therein because a content of a non-oxidized metal is not higher than 1 mole % of a metal component that constitutes the metal oxide and a packing density is 0.98 or higher.

7 Claims, 22 Drawing Sheets

METAL FILM AND METAL FILM-COATED MEMBER, METAL OXIDE FILM AND METAL OXIDE FILM-COATED MEMBER, THIN FILM FORMING APPARATUS AND THIN FILM FORMING METHOD FOR PRODUCING METAL FILM AND METAL OXIDE FILM

Matter enclosed in heavy brackets [ ] appears in the original patent but forms no part of this reissue specification; matter printed in italics indicates the additions made by reissue.

FIELD OF THE INVENTION

The present invention relates to a metal film and a metal film-coated member used for optical coating film or the like, a metal oxide film and a metal oxide film-coated member used for optical coating film, insulation film or the like, and a thin film forming apparatus and a thin film forming method preferably employed in the production of the metal film and the metal oxide film.

BACKGROUND OF THE INVENTION

Coating of various substrates with metal films has been employed for such applications as decoration, improvement of electric characteristics and optical functions. Such metal films are employed for making use of intrinsic physical properties of the metals such as luster, shade, electric properties and optical properties in accordance to the application, while it is desired that the physical properties remain stable for a long period of time.

In the case of metal films used in optical applications including reflector mirror such as those represented by silver and aluminum, such characteristics as reflectivity, spectral characteristic and durability have great importance. A reflector mirror for a liquid crystal image projector or a light tunnel (multi reflector) for DLP projector™ (manufactured by Balzers Limited), for example, has a metal film such as silver film formed as a specular surface on a glass substrate.

However, since the optical system of a liquid crystal image projector uses many reflector mirrors, it is required to minimize the loss of light caused on the reflecting surface. Also because unevenness in the spectrum of the reflected light has direct influence on the color consistency of the projected image, the reflection characteristic is required to be flat over the region of wavelengths to be used. Since the light rays are directed to the reflecting surface in a range of incident angles from 10 to 50°, variations in the reflection characteristic with the change in the incident angle must be minimized.

Meanwhile a metal film such as thin silver film formed by vacuum deposition is extremely vulnerable to the influence of the environment, and is subjected to white clouding caused by an oxide film formed on the surface thereof in about 24 hours when left in the atmosphere as it has been vapor-deposited, and the metal film may be blackened and peel off in the worst case. Also when the metal film does not sufficiently adhere to the base material, water may infiltrate into the interface with the base material and cause erosion.

Metal oxide films include $SiO_2$ film and titanium oxide ($TiO_2$, $Ti_2O_3$) film that are formed alternately as anti-reflection films on the surface of glass; $TiO_2$ film used as a coating of hydrophilic (anatase) material film on the surface of an outdoor protective plate and optical component such as mirror and lens; $Cr_2O_3$ film used as a high insulation film for coating on the surface of a glass member (so-called multi-form glass) that is used for the glass insulator of cathode ray tube electron gun; and $Cr_2O_3$ film used as a release film for coating on the surface of a ceramic mold made of SiC ceramic material or the like for forming glass lenses. There are many other metal oxide films used in diverse applications.

Ion plating process is often employed as the method for forming thin films whereby a metal film or a metal oxide film is formed on the surface of a substrate such as glass. In the ion plating process, atoms evaporated from a heated evaporation source are partially ionized by glow discharge or plasma generated by a high frequency antenna under a reduced pressure, thereby to form a metal film or a metal oxide film by vapor deposition on a substrate having a negative bias voltage applied thereto. Metal films and metal oxide films are also formed by the vacuum deposition method employing resistive healing wherein an evaporation source is heated and evaporated by resistive heating and is deposited on the substrate surface in vacuum.

However, since the metal films obtained by these methods have rough surfaces with the crystal being poorly oriented, it has been difficult to achieve high reflectivity. There have also been such problems as the while clouding of the metal film surface due to oxidation and weak bonding with the substrate surface as described previously.

In the case of chromium oxide film used as an electrical insulation film, for example, it is known that the resistivity changes depending on the oxygen content included in the film. To counter this problem, various attempts have been made to obtain chromium oxide films having high resistivity by accelerating oxidation when forming the thin film. However, since sufficient reaction energy cannot be obtained simply by accelerating oxidation in the case of vacuum deposition process in which chromium oxide is evaporated and deposited in oxygen gas atmosphere, the film tends to become deficient of oxygen resulting in insufficient resistivity. In the case of ion plating and sputtering processes, oxidizing reaction is accelerated but the substrate is attacked by carrier gas or the like thus making it difficult to control the composition.

When a plastic material is used as the substrate, sufficient bonding of a film thereto cannot be achieved by the prior art method, and it has been difficult to form an insulation film of practical value. Moreover, since the substrate cannot be maintained at a desired low temperature, materials that can be used in the substrate have been limited.

The thin film forming methods of the prior art described above have such a problem that a metal oxide film having a high packing density cannot be obtained. The packing density of a metal oxide film formed by the ion plating process or the sputtering process of the prior art is from 0.8 to 0.95 at the most. Such a low packing density (in other words abundance of voids in the film) affects the optical characteristics of the film, and therefore the metal oxide film of the prior art has a low and unsatisfactory reflectivity in the region of visible light.

SUMMARY OF THE INVENTION

A main object of the present invention is to provide a metal film of high quality single crystal that has very low surface roughness and very good crystal orientation and a metal film-coated member.

Another object of the present invention is to provide a dense metal oxide film that includes less oxygen defects and almost no voids therein, and a metal oxide film-coated member.

A still another object of the present invention is to provide a metal film that can be formed even on the surface of a substrate of low durable temperature and has an excellent bonding characteristic with the substrate, a metal film-coated member, a metal oxide film and a metal oxide film-coated member.

A further object of the present invention is to provide an optical coating film that has excellent optical characteristics.

A still further object of the present invention is to provide an optical coating film comprising a metal oxide film that has optical characteristics similar to those of a pure metal oxide film, and an insulation film comprising a metal oxide film that has a high insulation resistance.

A still further object of the present invention is to provide a thin film forming apparatus and a thin film forming method capable of forming a thin film that bonds closely with a substrate.

A still further object of the present invention is to provide a thin film forming apparatus and a thin film forming method in which a thin film is formed on a substrate kept at a low temperature.

A still further object of the present invention is to provide a reflector mirror comprising a silver film having excellent bonding characteristic, high durability and uniform and high reflectivity over a wide wavelength range in the visible light region, and an image projector apparatus using the reflector mirror.

The present inventors attained the following finding through a research to provide a method for forming a thin film that closely bonds with a substrate.

a) When a boat carrying a material to make a thin film (evaporation material) in a chamber is connected to an anode of DC voltage source;

b) the chamber is electrically floated and isolated from ground without electrical connection thereto; and c) the quantity of gas supply for generating plasma is controlled so as to be larger in the early stage of the thin film forming process than in the latter stage; then (1) high frequency discharge does not occur between the substrate holding member and the chamber, and charged particles in the plasma that is held in the chamber are not attracted to the inner wall of the chamber, and therefore the ionized particles or positively charged particles in the plasma are efficiently directed toward the substrate surface so that electrons in the plasma are concentrated on the evaporation material held in the boat;

(2) the evaporation material is evaporated by the irradiation of electron beam from the plasma when the plasma is stabilized; and (3) the electrons supplied from the plasma to collide with the evaporation material impart evaporation energy to the evaporation material so that the evaporation material that has received a sufficient amount of energy instead of thermal energy can be easily evaporated even at a low temperature. As a result, it is made possible to greatly reduce the energy required to heat the evaporation material by resistive heating or the like, so that the substrate can be prevented from being heated to a high temperature by thermal radiation from the evaporation source, and the thin film can be formed at a low temperature.

Meanwhile the inventors came upon a surprising finding as follows. Since the metal film formed by using the apparatus and the method described above is dense and includes almost no defects in the film, such a film of which surface roughness (arithmetic mean roughness) is very small (2 nm or less) that is made of single crystal having good crystal orientation (well oriented crystal) While it has not been made clear why such a metal film can be obtained, it is supposed that this is because the evaporation material is put into a high energy (excited) state due to the irradiation with the electron beam despite the low temperature.

Specifically, the metal film of the present invention has an arithmetic mean roughness of the surface not larger than 2 nm and a (111) peak intensity of X-ray diffraction not less than 20 times the sum of all other peaks.

The metal film of the present invention, that has such a constitution as described above, also has the following features.

(i) Reflectivity is very near to the theoretical value of a pure metal, with a difference as small as 0.2% or less, in the visible light region (approximately 400 to 700 nm).

(ii) Variations in the reflectivity are very small, within 0.5%, in a range of incident angles of light from 10 to 50°.

(iii) Reflectivity is very near to the theoretical value of a pure metal, with a difference as small as 0.2% or less, in a range of wavelengths of light from 250 to 400 nm (ultraviolet to blue light).

(iv) Good bonding with the substrate (v) Such a greatly improved durability that does not allow corrosion even when exposed to the atmosphere.

The features (iii) through (v) are conspicuous particularly in an Ag film.

The metal film of the present invention may be made of at least a metal selected from the group consisting of Ag, Cu, Au, Pt, Al, Ti, Cr, Ni, Fe, W, Zn and Si.

The metal film-coated member of the present invention is made by forming the metal film on a substrate. According to the invention, an anti-reflection film comprising a plurality of dielectric material layers may also be formed on the surface of the metal film. Instead of the anti-reflection film, a reflection enhancement film, a protective film or other may be formed. The multi-layer of dielectric material film may be made of, for example, $MgF_2$, $TiO_2$, $Al_2O_3$, $ZrO_2$ or $SiO_2$.

The substrate maybe made of glass, ceramics, semiconductor material, metallic material or plastic.

The metal film of the present invention is formed by the thin film forming method of depositing a material of a thin film turned into plasma on the surface of a substrate that is maintained at a temperature not higher than 100° C., preferably 80° C. or lower, and more preferably 60° C. or lower, and has an arithmetic mean roughness of the surface being 2 nm or less and a (111) peak intensity of X-ray diffraction being not less than 20 times the sum of all other peaks.

Specifically, the metal film of the present invention is formed by the thin film forming method comprising the steps of holding a substrate, over the surface of which a thin film made of a metal is to be formed, in a chamber; supplying a gas for generating plasma into the chamber; applying high frequency electric field in the inner space of the chamber; heating and evaporating an evaporation material that is the material to make the thin film; and controlling the gas supply wherein the quantity of the gas supplied into the chamber for generating plasma is controlled so as to be larger in the early stage of the thin film forming process than in the latter stage, while the substrate is maintained at a temperature not higher than 80° C. when the thin film is being formed. The metal film has an arithmetic mean roughness of the surface being 2 nm or less and a (111) peak intensity of X-ray diffraction not less than 20 times the sum of all other peaks.

According to the present invention, it is preferable to include the step of applying a direct current voltage across the substrate and the boat that holds the evaporation material, with the boat serving as an anode. The chamber is preferably electrically floated.

The optical film of the present invention is made of a metal film that has an arithmetic mean roughness of the surface being 2 nm or less and a (111) peak intensity of X-ray diffraction not less than 20 times the sum of all other peaks, of which reflectivity is very near to the theoretical value of a pure metal, with a difference in the reflectivity from the theoretical value of the pure metal being as small as 0.2% or less, in the visible light region. In this case, variations in the reflectivity are preferably not larger than 0.5%, in a range of incident angles of light from 10 to 50°.

Another optical film of the present invention is made of a metal film that has an arithmetic mean roughness of the surface being 2 nm or less and a (111) peak intensity of X-ray diffraction not less than 20 times the sum of all other peaks, of which reflectivity is very near to the theoretical value of a pure metal, with a difference in the reflectivity from the theoretical value of a pure metal being as small as 0.2% or less, in a range of wavelengths of light from 250 to 400 nm.

For the metal film used as such an optical coating film as described above, silver, aluminum, copper, chromium or the like is preferably used, while silver is the most preferable because of the flat and high reflection characteristic in the visible light region and relatively high reflection characteristic at smaller wavelengths such as blue region.

The present inventors also found the fact that, since almost all oxygen atoms are bonded with the metal atoms in the metal oxide film formed by the thin film forming apparatus and the method described above, an ideal metal oxide film is obtained that is almost free from oxygen defect and high packing density because there are almost no voids in the film. While it has not been made clear why such an ideal metal oxide film can be obtained, it is supposed that this is because the atoms or molecules of the evaporation material are arranged in a stable state and a high reaction energy enough to accelerate oxidation is imparted to the evaporation material by the irradiation of electrons.

The metal oxide film of the present invention has been completed on the basis of the findings described above, wherein a content of a non-oxidized metal is not higher than 1 mole % of the metal component that constitutes the metal oxide, and a packing density is 0.98 or higher.

The metal oxide film of the present invention is very dense with the packing density of 0.98 or higher and almost no voids included therein. Therefore, since light is less scattered within the film resulting in smaller loss of light, such an excellent optical characteristic is provided as the reflectivity in the visible light region is improved to be near to the theoretical value (that of a metal oxide film completely oxidized) with a difference from the theoretical value as small as 0.2% or less.

The metal oxide film of the present invention is also an ideal metal oxide film that is almost free from oxygen defect, wherein almost all oxygen atoms are bonded with the metal having non-oxidized metal content being not higher than 1 mole %. Consequently, the metal oxide film of the present invention has a very high insulation resistance of 1 GΩ or higher. In order to obtain even higher insulation characteristic, the non-oxidized metal content is preferably not higher than 0.1 mole %.

While there is no limitation to the composition of the metal oxide film of the present invention, it is preferably at least one selected from the group consisting of chromium oxide, silicon oxide, titanium oxide, aluminum oxide, zirconium oxide, hafnium oxide and indium oxide.

The metal oxide film-coated member of the present invention comprises the metal oxide film described above being formed on the substrate.

Since the metal oxide film of the present invention can be formed at a low temperature, there is no limitation to the material of the substrate. Therefore glass, ceramics, semiconductor, metal or plastic may he used for the substrate. In particular, a resin film made of, for example, PET (polyethylene terephthalate) used for OHP (overhead projector) sheet or the like can be employed as the substrate.

The metal oxide film of the present invention is formed by the thin film forming method of depositing a material of a thin film turned into plasma on the surface of the substrate that is maintained at a temperature not higher than 100° C., preferably 60° C. or lower, and has a non-oxidized metal content being not higher than 1 mole % of the metal component that constitutes the metal oxide, and a packing density of 0.98 or higher.

Specifically, the metal oxide film of the present invention is formed by the thin film forming method comprising the steps of holding the substrate over the surface of which a thin film made of a metal oxide is to be formed in a chamber; supplying a gas for generating plasma and oxygen gas into the chamber; applying high frequency electric field in the inner space of the chamber; heating and evaporating an evaporation material that is the material to make the thin film in the chamber; and controlling the gas supply wherein the quantity of gas supplied into the chamber for generating plasma is controlled so as to be larger in the early stage of the thin film forming process than in the latter stage, while the substrate is maintained at a temperature of 60° C. or lower throughout the period when the thin film is formed. The metal oxide film has the content of a non-oxidized metal being not higher than 1 mole % of the metal component that constitutes the metal oxide, and a packing density of 0.98 or higher.

According to the present invention, it is preferable to include the step of applying a direct current voltage across the substrate and the boat that holds the evaporation material, with the boat serving as an anode. The chamber is preferably floated electrically.

The invention also provides an optical coating film that is made of the metal oxide film wherein the content of a non-oxidized metal is not higher than 1 mole % of the metal component which constitutes the metal oxide, and the packing density is 0.98 or higher, and has a difference in reflectivity from the theoretical value as small as 0.2% or less in the visible light region. This optical coating film makes use of the optical characteristics of the metal oxide film of the present invention described above. The optical coating film may be used, for example, as a light reflecting film, an antireflection film, various dichroic filter films, reflection enhancement film, infrared cutoff filter film, various cold filter films, and a protective film for a metal film used in optical applications.

The invention also provides an insulation film that is made of a metal oxide film of which content of a non-oxidized metal is not higher than 1 mole % of the metal component which constitutes the metal oxide, and the packing density is 0.98 or higher, and that has insulation resistance as high as 1 GΩ or higher. This insulation film makes use of the insulation characteristics of the metal oxide film of the present invention described above.

The thin film forming apparatus suited for forming the metal film and the metal oxide film described above comprises a chamber wherein the thin film forming process is carried out; a substrate holding means that is made of an electrically conductive material and holds the substrate, over the surface of which a thin film is to be formed, in the chamber; a high frequency power supply that supplies high frequency electric power to the substrate holding means; an evaporation source that is formed in the chamber, and that has a boat for holding an evaporation material used as the material of the thin film, and a heating means for heating the boat; a gas supply means that supplies a gas for generating plasma into the chamber; and a gas supply control means that controls the quantity of the gas supplied by the gas supply means into the chamber so that the quantity of gas supply is larger in the early stage of the thin film forming process than in the latter stage.

The thin film forming apparatus further includes a vacuum level measuring means that measures the pressure in the chamber, while the gas supply control means controls the quantity of gas supplied by the gas supply means so that pressure in the chamber measured by the vacuum level measuring means is maintained at a predetermined level. The predetermined value of pressure is preferably in a range from $1.0\times10^{-2}$ to $5.0\times10^{-2}$ Pa.

The apparatus also includes a DC voltage source that is connected between the substrate and the boat, with the boat serving as an anode. The chamber is preferably floated electrically. The chamber is preferably made of an electrically conductive material, in order to secure electromagnetic shielding of the chamber, and to prevent high frequency electric field from leaking to the outside, thereby applying efficiently high frequency electric field.

The thin film forming method of the present invention that is suited for forming the metal film and the metal oxide film comprises the steps of holding a substrate, over the surface of which the thin film is to be formed, in the chamber; supplying the gas for generating plasma into the chamber; applying high frequency electric field in the inner space of the chamber; heating and evaporating the evaporation material that is the material to make the thin film in the chamber; and controlling the gas supply wherein the quantity of gas supplied into the chamber is controlled so as to be larger in the early stage of the thin film forming process than in the latter stage.

It is preferable that the substrate is maintained at a temperature not higher than 100° C. when the thin film is being formed on the substrate surface. The evaporation material is a metal, a metal oxide, a metal salt or a polymer compound.

Another thin film forming apparatus of the present invention comprises a chamber that is electrically floated wherein the thin film forming process is carried out; a substrate holding means that is made of an electrically conductive material and holds the substrate, over the surface of which a thin film is to be formed, in the chamber; a high frequency power source that supplies high frequency electric power to the substrate holding means; an evaporation source that is formed in the chamber, and that has a boat for holding an evaporation material used as the material of the thin film, and a heating means for heating the boat; a boat that is disposed in the chamber and holds the evaporation material used as the material to make the thin film; an evaporation source provided with a heating means that heats the boat; a gas supply means that supplies the gas for generating plasma into the chamber; and a DC voltage source that is connected between the substrate and the boat, with the boat serving as an anode.

Another thin film forming method of the present invention comprises the steps of holding a substrate by a substrate holding means that is made of an electrically conductive material in the electrically conductive chamber that is electrically floated; supplying high frequency electric power to the substrate holding means; heating the boat that holds the evaporation material used as the material of the thin film in the chamber; supplying a gas for generating plasma into the chamber; and applying a DC voltage between the substrate holding means and the boat, while using the boat as an anode.

The present invention also provides a reflector mirror comprising a substrate and a reflection layer made of a silver layer, which has an arithmetic mean roughness of the surface being 3 nm or less and a (111) peak intensity of X-ray diffraction not less than 20 times the sum of all other peaks, formed on the surface of the substrate.

Specifically, according to the present invention, it has been found a new fact that a reflector mirror having the following features can be obtained when the reflection layer made of the silver layer is a layer made of a single crystal that has a very small roughness (arithmetic mean roughness) of 3 nm or less and very good crystal orientation (uniformly arranged in a single direction).

(1) Light reflectivity is as high as 98% or higher over a wide range of wavelengths from 420 to 700 nm (substantially the visible light region).

(2) Variations in the reflectivity are very small, within 0.5%, in a range of incident angles of light from 10 to 50°.

(3) Superbly bonds with the substrate, dielectric material layer or the like.

(4) Good bonding with other layers makes the film resistant to corrosion with greatly improved durability.

The present inventors succeeded in making a reflector mirror having improved bonding characteristic and durability by employing a particular layer constitution as described below. That is, the reflector mirror of the present invention is made by forming a dielectric layer made of at least one of material selected from the group consisting of $LaTiO_3$, $La_2Ti_3O_8$, $SiO_2$, $TiO_2$ and $Al_2O_3$, a reflector layer made of a silver layer, a first transparent dielectric layer made of $MgF_2$ or $SiO_2$, and a second transparent dielectric layer made of at least one of material selected from the group consisting of $La_2TiO_3$, $La_2Ti_3O_8$, $SiO_2$, $TiO_2$ and $Al_2O_3$, that are placed one on another in this order from the substrate side. The reflector layer has an arithmetic mean roughness of 3 nm or less on the surface of the first transparent dielectric layer and a (111) peak intensity of X-ray diffraction not less than 20 times the sum of all other peaks. Glass, ceramics, semiconductor material, metal or plastic may be used for the substrate.

The reflector mirror has mean reflectivity of 98% or higher, averaging the reflectivity of P polarization and S polarization, for incident light having wavelength in a range from 420 to 700 nm and incoming at an angle of 45° or less.

The reflector layer made of silver is formed by the thin film forming method of depositing a material for the thin film turned into plasma on the surface of the substrate that is maintained at a temperature of 60° C. or lower, so as to achieve an arithmetic mean roughness of the surface 3 nm or less and a (111) peak intensity of X-ray diffraction not less than 20 times the sum of all other peaks. Layers other than the reflector layer are also formed similarly by the low temperature thin film forming method.

Specifically, the reflector mirror is made by forming the dielectric layer, the reflector layer, the first transparent dielectric layer and the second transparent dielectric layer one on another in this order on the surface of the substrate by the thin film forming method in which the substrate is maintained at a temperature of 60° C. or lower, the thin film forming method comprising the steps of holding the substrate in the chamber; supplying the gas for generating plasma into the chamber; applying high frequency electric field in the inner space of the chamber; heating to evaporate the evaporation material that is the material to make the layers in the chamber; and controlling the gas supply wherein the quantity of gas supplied into the chamber is controlled so as to be larger in the early stage of the period of forming the layers than in the latter stage.

Thus according to the present invention, since all layers are formed at a low temperature, preferably continuously, gap between the layers particularly the gap between the reflector layer and the first transparent dielectric layer formed thereon is eliminated, with a result of improved bonding between the reflector layer and the first transparent dielectric layer and improved humidity resistance and corrosion resistance. In addition to the reflector layer of the present invention having high durability to resist corrosion and the reflector mirror as a whole having extremely high corrosion resistance. Further, according to the present invention, since all the layers are formed successively by the low temperature film forming method, the reflector mirror can be produced efficiently and at a lower cost.

An image projector apparatus of the present invention is provided with the reflector mirror mentioned above. Specifically, the image projector comprises a light source, a color separator for separating light from the light source into a plurality of chromatic lights, a light modulator for modulating each chromatic light separated by the color separator, a chromatic light synthesizer that synthesizes each chromatic light modulated by the light modulator to form image light, and a projection lens that projects the light image from the chromatic light synthesizer onto a screen, wherein the reflector mirror is disposed in the optical path from the light source to the projection lens.

Other objects and advantages of the present invention will become apparent in the detailed description that follows.

DETAILED DESCRIPTION OF THE INVENTION

[I] Metal Film

The metal film of the present invention has an arithmetic mean roughness of the surface being 2 nm or less and a (111) peak intensity of X-ray diffraction not less than 20 times the sum of all other peaks.

Surface roughness of a metal film can be measured by observing with an atomic force microscope (AFM). The atomic force microscope is capable of taking an image of the surface irregularity with an accuracy on the order of nanometers by bringing a probe carried by a cantilever near to the surface and using the flexure of laser beam from the cantilever to measure the displacement thereof that is caused by the atomic force. The surface roughness measured with the atomic force microscope being 2 nm or less means that the surface is practically flat. This eliminates the scatter of light on the film surface that is a major cause of deterioration in the reflectivity.

The metal film also has a (111) peak intensity of X-ray diffraction that is 20 times the sum of all other peaks or greater. This means that the material has good crystal orientation and high density, with the metal film having homogeneous properties. This eliminates the absorption and scatter of light in the film that is major causes of deterioration in the reflectivity. Absorption of light means that the energy of light is transformed into heat and is lost within the film, that is caused when the film includes defects such as impurity.

Thus it is supposed that the high reflectivity of the metal film of the present invention has been achieved by the dense and flat construction that suppresses scatter and absorption of light.

Figure 1:
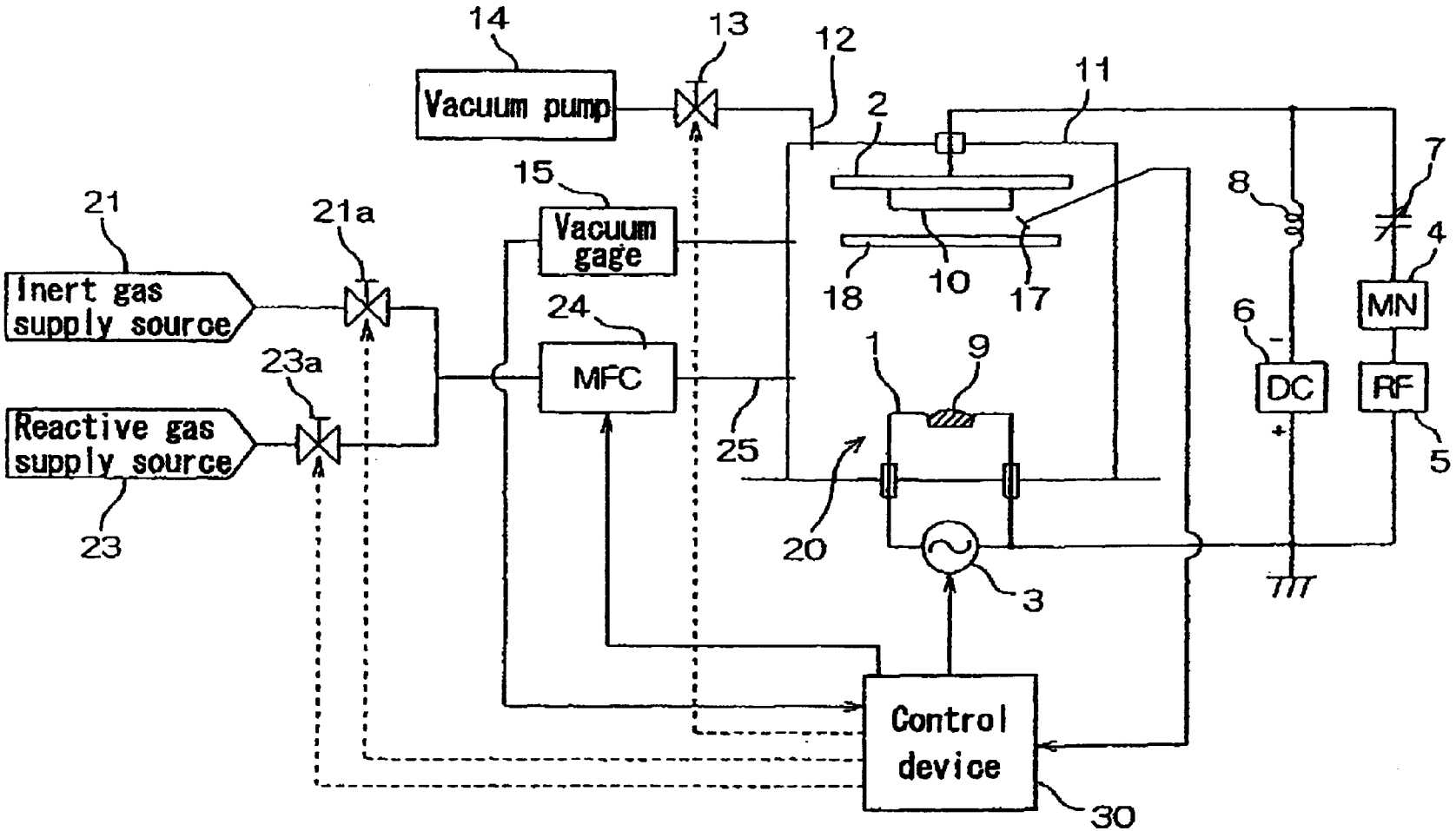
FIG. 1 is a schematic view showing an example of the thin film forming apparatus for producing the metal film or the metal oxide film of the present invention.

Now the method for forming the metal film of the present invention will be described below. FIG. 1 schematically shows the apparatus used in forming the thin film. Disposed at the bottom of a chamber 11 is an evaporation source 20 that holds an evaporation material 9 in a boat 1. A substrate holding section 2 that holds the substrate 10 is provided above the evaporation source 20 while opposing thereto in the chamber 11.

The substrate holding section 2 is made of an electrically conductive material and receives high frequency power supplied from a high frequency power source (RF) 5 via a matching device (MN) 4 and a capacitor 7 serving as a DC cutoff filter. The capacitor 7 may also be constituted from a variable capacitor mat performs a part of the function of the matching circuit. The substrate holding section 2 is also connected with a cathode of the DC voltage source (DC) 6 via a coil 8 that serves as a high frequency cutoff filter. A terminal of the high frequency power source 5 located opposite to the substrate holding section 2 is connected to an anode of the DC voltage source 6, both of which being grounded.

The boat 1 is made of a material having high electrical resistance, and receives electric power supplied from a heating power source 3 comprising, for example, an alternate current power source, so as to generate heat for evaporating the evaporation material 9. The boat 1 is also connected to the anode of the DC voltage source 6.

The space in the chamber 11 is evacuated by a vacuum pump 14 via an exhaust duct 12 and an exhaust valve 13, so as to achieve a predetermined level of vacuum during the period of forming the thin film.

An inert gas supply source 21 is connected via a flow controller (MFC) 24 and a gas supply pipe 25 to the chamber 11, in order to supply an inert gas (for example, argon gas) into the chamber 11. Supply from the inert gas supply source 21 is turned on and off by opening and closing a valve 21a. While the apparatus shown in FIG. 1 has a reactive gas supply source 23 provided for supplying a reactive gas such as oxygen, this is not used when forming a metal film.

Pressure in the chamber 11 is measured with a vacuum gage 15, so that the flow controller 24 is controlled by a control device 30 comprising a microcomputer or the like according to the output signal from the vacuum gage 15. Thus the flow rate of the gas supplied by the inert gas supply source 21 is controlled so as to maintain the pressure in the chamber 11 at a predetermined level. Pressure in the chamber 11 is preferably in a range from $1.0\times10^{-2}$ to $5.0\times10^{-2}$ Pa, more preferably $2.5\times10^{-2}$ to $3.5\times10^{-2}$ Pa in order to obtain the metal film of the present invention.

In order to measure the rate of forming the thin film on the surface of the substrate 10, a film thickness monitor 17 is provided in relation to the substrate holding section 2. Output signal of the film thickness monitor 17 is sent to the control device 30 that controls the output power of the heating power source 3 according to the output signal of the film thickness monitor 17. Thus the power supply to the boat 1 is controlled to regulate the amount of the evaporation material 9 to be evaporated, so that the thin film is formed at the predetermined rate. The rate of forming the metal film is preferably in a range from 10 to 20 Å/second, more preferably from 15 to 18 Å/second, in order to obtain the metal film of the present invention.

The high frequency power source 5 may be a high frequency power source oscillating at a frequency, for example, from 10 to 50 MHz, while the frequency may be set at 13.56 MHz, while supplying high frequency power of 50 to 800 mW per unit area ($cm^2$) of the substrate holding section 2 that serves as a discharge electrode, preferably from 85 to 170 $mW/cm^2$ to the substrate holding section 2. This causes high frequency electric field to be generated accordingly in the chamber 11, so that plasma is generated from the gas supplied from the gas supply pipe 25 and the vapor of the evaporation material 9. Of the ionized particles included in the plasma, positively charged particles are attracted toward the surface of the substrate 10 by the DC bias voltage applied by the DC voltage source 6 to the substrate holding section 2. Voltage applied by the DC voltage source 6 may be from 100 to 400 V, preferably from 180 to 230 V.

On the other hand, dissociated electrons in the plasma are attracted toward the boat 1 that is connected to the anode of the DC voltage source 6. At this time, since the evaporation material 9 in the evaporation source 20 is continuously evaporated, an illuminating body looking like a leg of the plasma extending down to the evaporation source 20 is observed near the evaporation source 20, due to the collision of the evaporated particles and electrons. Electrons gathering near the evaporation source 20 are attracted by the boat 1 that is grounded and connected to the anode, and collide with the evaporation material 9 held on the boat 1. Thus evaporation of the evaporation material 9 is accelerated by the heating of the boat 1 and the collision of the electrons. As a result, the effect of assisting the evaporation at a low temperature (deposition assisting effect) by the collision of concentrated electrons against the evaporation material 9 can be achieved.

As shown in FIG. 1, the chamber 11 is not grounded nor connected to either the DC voltage source 6 or high frequency power source 5. In other words, the chamber 11 is electrically floated. As a result, high frequency discharge does not occur between the substrate holding section 2 and the chamber 11, and the charged particles in the plasma contained in the chamber 11 are not attracted toward the inner wall of the chamber 11. Therefore, the positively ionized particles or positively charged particles in the plasma are efficiently directed toward the surface of the substrate 10, and electrons that have negative electricity included in the plasma are concentrated to the evaporation material 9 carried by the boat 1. Thus a satisfactory thin film can be formed and evaporation of the evaporation material 9 can be accelerated by the electron beam. Furthermore, deposition of the evaporation material on the inner wall of the chamber 11 can be suppressed.

When the plasma contained in the chamber 11 is stabilized, the evaporation material 9 is evaporated by the irradiation of the electron beam from the plasma onto the evaporation material 9. Accordingly, in order to maintain a constant rate of deposition of the evaporation material 9 onto the substrate 10, the control device 30 decreases the output power of the heating power source 3 according to the output signal from the film thickness monitor 17. Namely the current or voltage supplied to the boat 1 is decreased, thereby regulating the rate of evaporation.

Since the evaporation of the evaporation material 9 is assisted by the electron beam supplied from the plasma, heating current supplied to the boat 1 can be made lower, so that it is made possible to maintain the evaporation of the evaporation material 9 at a relatively low temperature and form the thin film through vapor deposition by making use of the plasma action.

The process of forming the thin film in this embodiment is characterized by the method of supplying the inert gas to the chamber 11. That is, in this embodiment, the gas is supplied into the chamber 11 from the gas supply pipe 25 at a relatively large flow rate in the early stage of the thin film formation and, when the evaporation material 9 is evaporated vigorously, gas supply from the gas supply pipe 25 is decreased. Thus plasma of the inert gas supplied from the gas supply pipe 25 is formed in the chamber 11 in the early stage of thin film formation when evaporation of the evaporation material 9 is not strong. When the evaporation material 9 is evaporated vigorously, gas supply from the gas supply pipe 25 is decreased so that plasma of such a composition as the evaporated particles from the evaporation material 9 is predominant is formed in the chamber 11.

Thus stable plasma can be quickly formed in the chamber 11 by introducing the inert gas into the chamber 11 in the early stage of the thin film formation as described above. Since this makes it possible to start the formation of the thin film by making use of the plasma action in the early stage, thin film having good bonding characteristic can be formed on the surface of the substrate 10.

Figure 2:
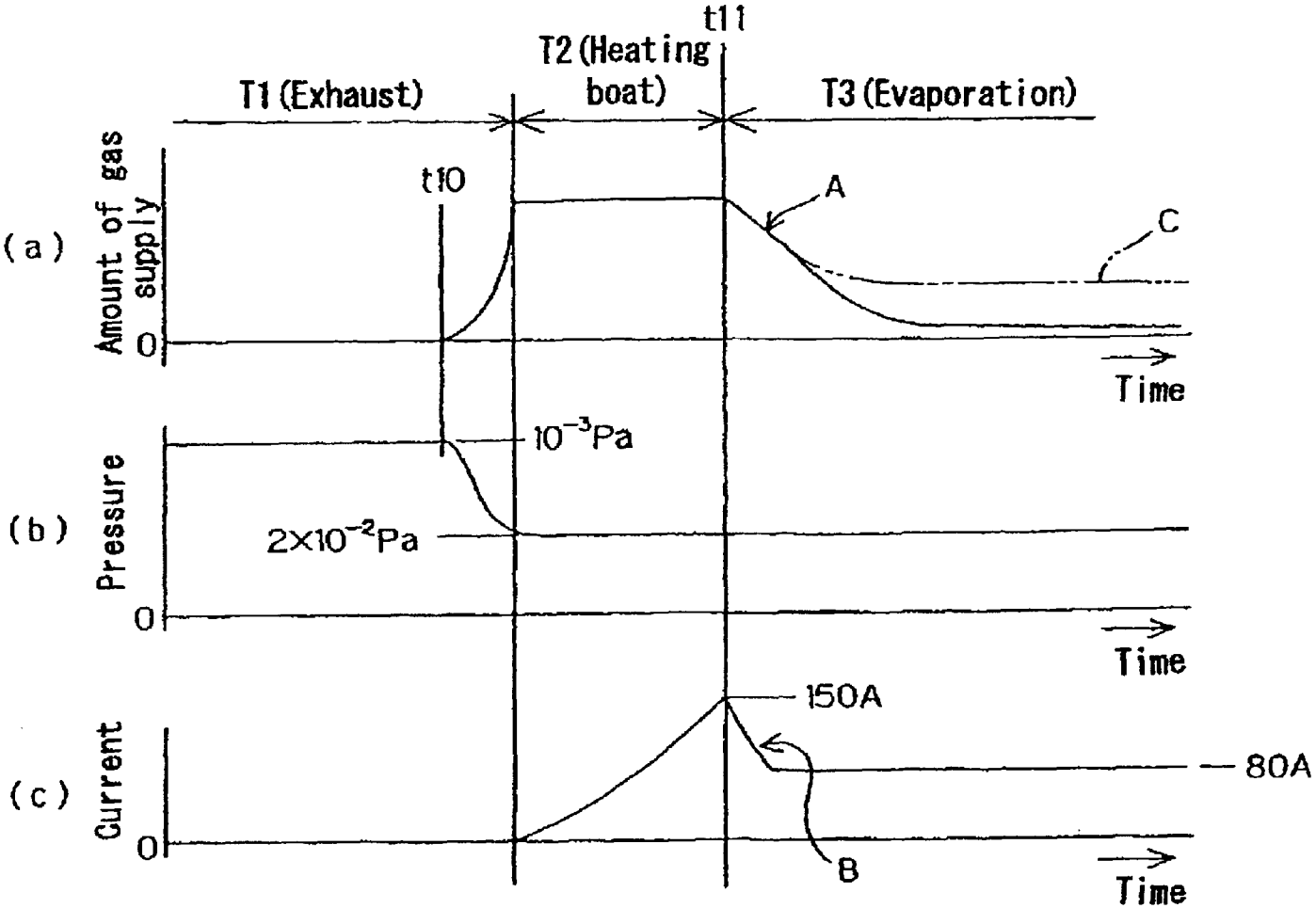
FIG. 2 is an explanatory view showing the process of forming the thin film.

FIG. 2 is a diagram explaining the process of forming the thin film in more detail. In FIG. 2, an example of process to form the thin film while supplying the inert gas from the inert gas supply source 21 into the chamber 11 is shown in case a metal film is formed on the surface of the substrate 10. Specifically, FIG. 2(a) shows the amount of gas supply changing with time, FIG. 2(b) shows the pressure in the chamber 11 changing with time and FIG. 2(c) shows the heating current supplied to the boat 1 changing with time.

The control device 30 opens the exhaust valve 13 in a period T1 before starting the formation of the thin film, so that inside of the chamber 11 is evacuated by the vacuum pump 14, to maintain the pressure in the chamber 11 at, for example, about $10^{-3}$ Pa. Then the control deice 30 opens the valve 21a at time t10 so as to supply the gas from the inert gas source 21. Once supply of the gas is started, the control device 30 monitors the output signal of the vacuum gage 15 and controls the flow rate controller 24 so as to maintain the pressure in the chamber 11 at, for example, about $2\times10^{-2}$ Pa.

Thus in the period T2 during which current supply to the boat 1 is started and the evaporation material 9 is heated, plasma is generated in the chamber 11 by the high frequency electric field applied by the high frequency power source 5. Atoms and molecules of the ionized inert gas included in the plasma are directed to the substrate 10 by the DC bias voltage that is applied by the DC voltage source 6 to the substrate holding section 2. In case the substrate 10 is heated to an undesirably high temperature during the period T2 by the collision of the atoms and molecules of the inert gas with the substrate 10, a shutter 18 maybe provided below the substrate 10 so as to block the flow of the inert gas toward the substrate 10.

During the period T2, the control device 30 controls the heating power source 3 to start the energization of the boat 1. This causes heating current to be supplied to the boat 1 and increase to, for example, 150 A at the end of the period T2.

At lime t11 when the plasma in the chamber 11 is stabilized, the shutter 18 is opened by a drive device (not shown) that is controlled by the control device 30, so that formation of the thin film is started. Since the evaporated particles of the evaporation material 9 are guided into the plasma, pressure in the chamber 11 increases when the gas is supplied from the gas supply pipe 25 into the chamber 11.

Meanwhile the control device 30 controls the flow rate controller 24 so as to maintain the pressure in the chamber 11 at a constant level (for example, about $2\times10^{-2}$ Pa), thus regulating the supply of gas through the gas supply pipe 25. As a result, the amount of inert gas introduced into the chamber 11 decreases as shown by symbol A as the amount of evaporation from the evaporation material 9 increases. Therefore, composition of the plasma is dominated by the inert gas in the early stage of the period T3 when the thin film is being formed, but quickly changes to be dominated by the evaporated particles of the evaporation material 9.

On the other hand, since evaporation of the evaporation material 9 is assisted by the supply of electrons from the plasma, current supplied from the heating power source 3 to the boat 1 decreases as indicated by symbol B, due to the feedback control based on the output from the film thickness monitor 17. For example, current decreases from 150 A to 80 A after a period of about 2 to 3 seconds. Therefore, since the evaporation material 9 is evaporated at a temperature lower than in the case of ordinary vapor deposition or ion plating process, the substrate 10 is prevented from being heated to an excessively high temperature by the radiation heat from the evaporation source 20.

According to this embodiment, as described above, satisfactory plasma can be formed in the chamber 11 as early as the initial stage of the thin film forming process. Accordingly, the evaporation material is guided efficiently to the substrate 10 under the action of the plasma since the early stage. As a result, the metal film having good bonding characteristic can be efficiently formed on the surface of the substrate 10.

According to the method of forming metal film, since the substrate 10 is maintained at a temperature not higher than 100° C., preferably 80° C. or lower, and more preferably 60° C., the method is suited for forming a metal film on the substrate 10 made of glass, ceramics, semiconductor material, metallic material, plastic or resin film. For example, since polycarbonate can endure a temperature from 120 to 130° C. and polymethyl methacrylate can endure a temperature of about 80° C., the metal film can be formed on the substrate 10 made any of these materials.

Figure 3:
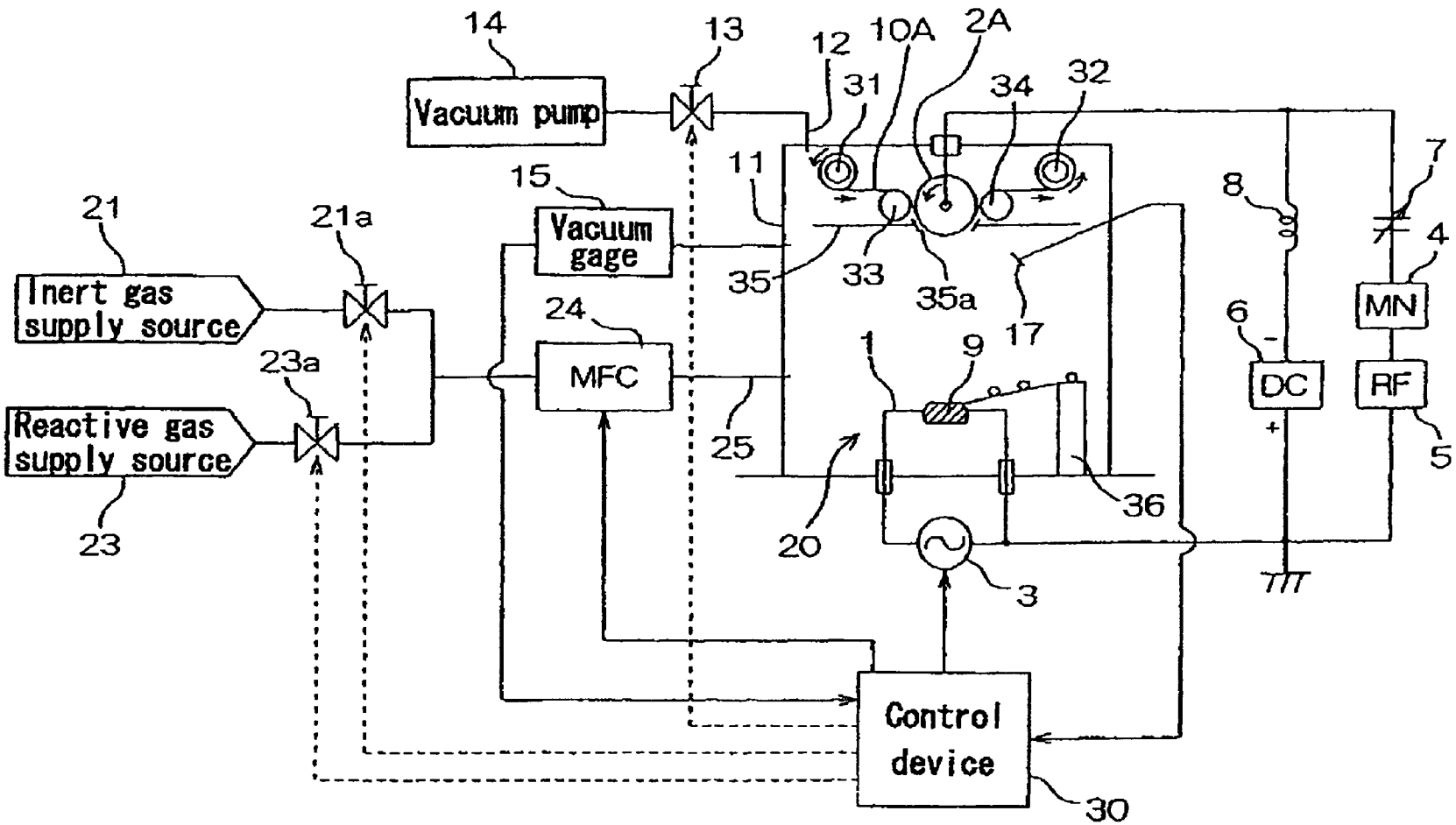
FIG. 3 is a schematic view showing another example of the thin film forming apparatus.

FIG. 3 shows another example of the thin film forming apparatus used in the present invention. In this drawing, components identical to those shown in FIG. 1 are denoted with the identical reference numerals and description thereof will be omitted.

This apparatus has a feed roller 31 having a tape of film substrate 10A (resin film or the like) wound thereon and a take-up roller 32 whereon the film substrate 10 A that has been fed from the feed roller 31 is wound up being disposed in the chamber 11, while a high frequency shaft electrode 2A is disposed as the substrate holding section between the rollers. Disposed on both sides of the high frequency shaft electrode 2A are auxiliary shafts 33, 34.

The high frequency shaft electrode 2A comprises a round rod made of an electrically conductive material, that receives high frequency power from the high frequency power source 5 and a DC bias voltage from the DC voltage source 6.

Disposed below the feed roller 31 and the take-up roller 32 is a shield plate 35 that has an aperture 35a for exposing the film substrate 10A toward the bottom surface of the high frequency shall electrode 2A.

In relation to the evaporation source 20, a coating material supplier 36 is provided for supplying the evaporation material to the boat 1.

In this constitution, the metal film can be formed continuously on the surface of the film substrate 10A that is fed from the feed roller 31 while winding up the film substrate 10A around the take-up roller 32. Other operations are similar to those shown in FIG. 1 and FIG. 2.

According to the method of forming the metal film described above, since the gas for generating the plasma is supplied to the chamber 11, the plasma can be formed quickly in the chamber 11 in the early stage of the thin film forming process. This makes it possible to form the metal film by making use of the action of the plasma in the early stage of the thin film forming process, thereby to obtain the metal film having that superbly bonds with the substrate 10.

Since the flow rate of gas supply into the chamber 11 is made higher in the early stage of forming the thin film and is decreased later, the substrate 10 is prevented from being heated to an undesirably high temperature by the collision of the atoms and molecules of the inert gas, that is supplied into the chamber 11, onto the substrate 10.

Moreover, the positively charged particles or the positively ionized particles in the plasma are accelerated toward the substrate 10 by the DC electric field applied by the DC voltage source 6, so as to collide with the substrate 10 and deposit on the surface thereof. Thus the coating film is formed. Electrons having negative charge, on the other hand, are accelerated toward the boat 1 that is connected to the anode and are concentrated to collide with the evaporation material 9 that is held on the boat 1 thereby imparting the energy to evaporate the evaporation material 9 thereto. Thus the evaporation material 9 that has received a high energy which substitutes thermal energy can be easily evaporated even at a low temperature, with the evaporated particles entering into the plasma forming region in the chamber 11. Since the so-called deposition assisting effect that the electrons included in the plasma formed in the chamber 11 are guided to the evaporation material 9 and accelerate the evaporation of the material is achieved, the energy required to heat the evaporation material 9 by resistive heating or the like can be greatly reduced. As a result, since temperature rise of the substrate 10 can be suppressed, the thin film can be formed at a lower temperature.

Thickness of the metal film of the present invention is from about 500 to 1500 Å, preferably from 800 to 1100 Å. A metal film having this thickness can be formed in about 5 to 10 minutes. Throughout this period, temperature of the substrate 10 does not exceed 100° C.

The amount of the evaporation material 9 evaporated is regulated by controlling the energy supplied to the heating means and the output of the DC voltage source 6 within the ranges described previously. Collision energy of the particles of the evaporation material 9 toward the substrate 10 is regulated by controlling the output of the DC voltage source 6 within the range described previously. Thus the evaporation material can be supplied with energy enough not only to simply deposit on the surface of the substrate 10 but also to rearrange the atoms or molecules of the layer of the evaporation material formed on the surface of the substrate 10 into a stable orientation. Also enough energy for the particles of the evaporation material to infiltrate into the substrate 10 and assimilate therein can be supplied.

Thus the present invention makes it possible to obtained a dense metal film having quality near that of single crystal of pure metal that is flat, almost free from defects in the film and has good bonding characteristic.

The metal film of the present invention can be used preferably in various applications as described below by making use of the excellent characteristics.

(1) When the substrate 10 is made of glass, it can be used in reflector mirror for liquid crystal projector and light tunnel whereon an Ag film is formed as a mirror coating, infrared ray reflector whereon an Au film is formed as a reflector film, a photometer having an Al film without protective film being formed as a reflector film, optical measuring instrument such as laser interferometer, etc.

(2) When the substrate 10 is made of a ceramic material, it can be used in ceramic wiring board, semiconductor devices mounting circuit board or semiconductor device package, etc. having a conductive layer formed thereon from at least one kind of material selected from the group consisting of Au, Cu, Al, Ag, Pt, Ti, Cr, Ni, W and Fe.

(3) When the substrate 10 is made of a semiconductor material, it can be used in anti-reflection member for infrared ray whereon ZnS, Si and ZnS are formed one on another on the substrate 10 made of Si, Ge or the like.

(4) When the substrate 10 is made of a plastic material, it can be used in high-reflection mirror of a special shape made by coating a substrate 10, that has the special shape with designed surface irregularity formed thereon by molding, with Al, Ag or the like.

(5) When the substrate 10 is made of a resin film, it can be used in thin film resistor having Ti, Al or the like formed thereon, solar cell or thin film capacitor having Si film formed thereon.

(6) When the substrate 10 is made of a metallic material, it can be used in condenser mirror for infrared lamp comprising a substrate 10 made of Al having an Au film or the like formed thereon as a reflecting film, etc.

(7) Metal film-coated member having the metal film of the present invention with metal oxide film and fluoride film formed one on another to prevent the metal film from deteriorating.

Particularly, since the metal film of the present invention has good optical characteristic of such a reflectivity that is near to the theoretical value of a pure metal, with a difference therefrom as small as 0.2% or less, in the visible light region, the metal film can be most preferably used as an optical coating film such as optical reflecting film and anti-reflection film.

[II] Metal Oxide Film

The metal oxide film of the present invention has a content of a non-oxidized metal not higher than 1 mole % of the metal component that constitutes the metal oxide, and packing density of 0.98 or higher. The content (mole %) of the non-oxidized metal in the metal oxide film is measured by X-ray photoelectron spectroscopy as will be described in conjunction with embodiments later. When the content of the non-oxidized metal is higher than 1 mole %, oxygen defects increase and the insulation resistance and other characteristics decrease.

The packing density of the metal oxide film is defined as the packing ratio of (volume of substance constituting the film excluding voids) to (entire volume of film), and is measured by moisture test. That is, the metal oxide film is left to stand in an environment of 60° C. in temperature and 90% in humidity for 24 to 120 hours, to determine the change in refractive index from a change in reflectivity by measuring the change in reflectivity before and after standing in humidity. The smaller the change in refractive index, the greater the packing density. This method makes use of the fact that the reflectivity changes under the influence of moisture that enters the voids in the film.

Since changes in the refractive index of the metal oxide film of the present invention remain within 0.2%, the packing density is estimated to be 0.98 or higher. The packing density of optical thin films of the prior art is in a range from 0.8 to 0.95.

Also, the metal oxide film of the present invention is superior in the bonding property with the substrate and durability. Thus, the metal oxide film of the present invention is a dense and durable oxidation film that includes less oxygen defects and almost no voids therein.

The metal oxide film of the present invention can be produced similarly to the production of the metal film described previously by using the thin film forming apparatus shown in FIG. 1 through FIG. 3, with the exception that the reactive gas is supplied into the chamber. The metal oxide film is preferably produced under the following conditions.

(1) The inert gas supply source 21 and the reactive gas supply source 23 are connected via the flow controller (MFC) 24 and the gas supply pipe 25 to the chamber 11, in order to supply oxygen gas as a reactive gas and the inert gas (for example, argon gas) into the chamber 11. Supplies from the inert gas supply source 21 and the reactive gas supply source 23 are turned on and off by opening and closing the valves 21a and 23a.

(2) Pressure in the chamber 11 during the film forming process is preferably in a range from $1.0\times10^{-2}$ to $5.0\times10^{-2}$ Pa, more preferably $2.0\times10^{-2}$ to $3.0\times10^{-2}$ Pa. At this time, oxygen gas concentration is controlled in a range from $1.0\times10^{-2}$ to $3.0\times10^{-2}$ Pa.

(3) The rate of forming the metal oxide film is from 5 to 20 Å/second, preferably from 13 to 18 Å/second.

(4) The control device 30 opens the exhaust valve 13 in a period T1 before starting the formation thin film, so that inside of the chamber 11 is evacuated by the vacuum pump 14, to maintain the pressure in the chamber 11 at, for example, about $10^{-3}$ Pa. Then the control device 30 opens the valves 21a, 23a at time t10 so as to supply the gases from the inert gas source 21 and the reactive gas supply source 23. Once supply of the gas is started, the control device 30 monitors the output signal of the vacuum gage 15 and controls the flow rate controller 24 so as to maintain the pressure in the chamber 11 at, for example, about $2\times10^{-2}$ Pa.

(5) Then the control device 30 controls the flow rate controller 24 so as to maintain the pressure in the chamber 11 at a constant level (for example, about $2\times10^{-2}$ Pa), thus regulating the supply of gas through the gas supply pipe 25. As a result, the amount of the inert gas introduced into the chamber 11 decreases as indicated by symbol A as the amount of evaporation from the evaporation material 9 increases. In this case, in order to supply the certain amount of oxygen gas into the plasma, the amount of gas supply is regulated so as to show change with time as indicated by symbol C. Therefore, composition of the plasma is dominated by the inert gas in the early stage of the period T3 when the thin film is being formed, but quickly changes to a state of being dominated by the evaporated particles of the evaporation material 9. As the amount of evaporation from the evaporation material 9 increases, the amount of oxygen gas introduced into the chamber 11 increases.

Thickness of the metal oxide film of the present invention is typically from 10 to 200 nm, while depending on the optical, insulation and other characteristics required. A metal oxide film having this thickness can be formed in about 2 to 10 minutes. Throughout this period, temperature of the substrate 10 does not exceed 100° C.

When the thin film forming apparatus and the method described above are employed, the evaporation material can be supplied with energy enough not only to simply deposit on the surface of the substrate 10 but also to rearrange the atoms or molecules of the layer of the evaporation material formed on the surface of the substrate 10 into a stable orientation, and also energy enough for the particles of the evaporation material to infiltrate into the substrate 10 and assimilate therein can be supplied. Therefore, such a metal oxide film similar to a pure metal oxide can be obtained that is very dense, includes less oxygen defects and good bonding characteristic, with the content of non-oxidized metal of 1 mole % or less and the packing density of 0.98 or higher.

Example of the metal oxide film of the present invention may be at least one selected from the group consisting of chromium oxide, silicon oxide, titanium oxide, aluminum oxide, zirconium oxide, hafnium oxide and indium oxide.

The metal oxide film-coated member of the present invention having such a metal oxide film formed on the surface of the substrate 10 may be used preferably in various applications as described below by making use of the excellent characteristics thereof, (1) When the substrate 10 is made of glass, it can be used in optical components such as optical lens, prism and half mirror, window material and screen of display apparatus as antireflection film made by forming $SiO_2$ film and $TiO_2$ film alternately; outdoor protection plate and optical components such as mirror and lens coated with $TiO_2$ film used as a coating of hydrophilic (anatase) film; and multi-form glass that is used for the glass insulator of cathode ray tube electron gun coated with a $Cr_2O_3$ film as a high insulation film.

(2) When the substrate 10 is made of a ceramic material, the metal oxide film-coated member of the present invention can be used in a ceramic mold made of SiC ceramic material or the like for forming glass lenses coated with $Cr_2O_3$ film used as a release film, etc.

(3) When the substrate 10 is made of a semiconductor material, it can be used in an integrated circuit device and optical semiconductor device such as semiconductor laser comprising a semiconductor substrate such as Si and GaAs coated with $SiO_2$ film, $Al_2O_3$ film or the like as an insulation film, passive alignment circuit board carrying semiconductor laser and optical fiber comprising an Si substrate coated with an $SiO_2$ film or the like as an insulation film or protective film, etc.

(4) When the substrate 10 is made of a plastic, it can be used in plastic lens, polarization sheet or the like whereon $SiO_2$ film, $ZrO_2$ film, $Al_2O_3$ film, $TiO_2$ film or the like is formed as an anti-reflection film.

(5) When the substrate 10 is made of a resin film, it can be used in OHP sheet or the like whereon $SiO_2$ film, $ZrO_2$ film, $Al_2O_3$ film, $TiO_2$ film or the like is formed as a protective film.

(6) When the substrate 10 is made of a metallic material, it can be used in a metallic mold made for forming glass coated with $Cr_2O_3$ film or the like used as a release film, etc.

(7) When the substrate 10 is made of a piezoelectric material such as lithium niobate, quartz or the like, it can be in piezoelectric element coated with an $SiO_2$ film or the like as a protective film, etc.

The metal oxide film of the present invention can be most preferably used as an optical coating film such as light reflecting film and anti-reflection film, because of such an excellent optical characteristic that the difference in reflectivity from the theoretical value is as small as 0.2% or less in the visible light region. There has been known no metal oxide film that has reflectivity of its own near to the theoretical value with a difference therefrom as small as 0.2% or less in the visible light region. Metal oxides particularly suitable for optical coating film include the oxides of metals of the Group 3 (3A), Group 4 (4A), Group 5 (5A), Group 6 (6A), Group 13 (3B) and Group 14 (4B) in the Periodic Table such as titanium oxide, zirconium oxide, aluminum oxide, hafnium oxide and silicon oxide (number in parentheses are old group numbers).

The metal oxide film of the present invention is also best suited for the use as an insulation film because of the very high insulation resistance of 1 GΩ or higher. There has been known no metal oxide film that has insulation resistance of 1 GΩ or higher as a single metal oxide film. Metal oxide films particularly suited for the use as insulation film may be made of, for example, chromium oxide.

[III] Reflector Mirror

The reflector mirror having the silver film of the present invention is made by forming, on the surface of a substrate 80, a dielectric layer 81 made of at least one kind of material selected from the group consisting of $LaTiO_3$, $La_2Ti_3O_8$, $SiO_2$, $TiO_2$, and $Al_2O_3$, a reflection layer 82 made of silver, a first transparent dielectric layer 83 made of $MgF_2$ or $SiO_2$, and a second transparent dielectric layer 84 made of at least one kind of material selected from the group consisting of $LaTiO_3$, $La_2Ti_3O_8$, $SiO_2$, $TiO_2$, and $Al_2O_3$ one on another in this order from the substrate 80 side.

The dielectric layer 81 serves as a bonding layer that enhances bonding between the reflection layer 82 and the substrate 80. Thickness of the dielectric layer 81 is preferably from 30 to 80 nm in consideration of bonding. Thickness of the dielectric layer 81 less than 30 nm makes it susceptible to deterioration of bonding performance. Since the dielectric layer 81 is desired to be as thin as possible as long as good bonding can be achieved, thickness of the dielectric layer 81 is preferably 80 nm or less.

Thickness of the reflection layer 82 is preferably from 70 to 130 nm. Thickness of the reflection layer 82 less than 70 nm leads to lower reflectivity because it becomes easier for light to transmit therethrough. On the other hand, since thickness of the reflection layer 82 larger than 130 nm does not improve the reflectivity while requiring it to use expensive silver in larger quantity, it is not desirable that the reflection layer 82 is too thick.

The first transparent dielectric layer 83 and the second transparent dielectric layer 84 constitute a high reflection layer (reflection enhancement layer) based on multi-layer interference. As such, thickness of these layers is determined according to the refractive index thereof and the wavelength of light. The second transparent dielectric layer 84 has higher refractive index than the first transparent dielectric layer 83 does. When maximum reflectivity is to be obtained in the visible light region by using $MgF_2$ for the first transparent dielectric layer 83 and $La_2Ti_3O_8$ for the second transparent dielectric layer 84, for example, thickness of the first transparent dielectric layer 83 is about 73 nm and thickness of the second transparent dielectric layer 84 is about 60 nm.

The reflection layer 82 has an arithmetic mean roughness of the surface on the first transparent dielectric layer 83 side being 3 nm (0.003 μm) or less and a (111) peak intensity of X-ray diffraction not less than 20 times the sum of all other peaks.

Surface roughness of the reflection layer 82 can be measured by observing with an atomic force microscope (AFM). The atomic force microscope is capable of taking an image of the surface irregularity with an accuracy on the order of nanometers by bringing a probe carried by a cantilever near to the surface and using the reflection of laser beam from the cantilever to measure the deflection thereof that is caused by the atomic force. The surface roughness measured with the atomic force microscope being 3 nm or less means that the surface is practically flat. This eliminates the scatter of light on the surface of the layer that is a major cause of deterioration in the reflectivity.

The reflection layer 82 has a (111) peak intensity of X-ray diffraction not less than 20 times the sum of all other peaks. This means that the material has good crystal orientation and high density, with the metal film having homogeneous properties. This eliminates the absorption and scatter of light in the film that is major causes of deterioration in the reflectivity. Absorption of light means the energy of light being transformed into heat and lost within the film, that is caused when the film includes defects such as impurity.

Thus it is supposed that the high reflectivity of the reflection layer 82 is achieved by the dense and flat construction that suppress scatter and absorption of light.

The second transparent dielectric layer 84 has an arithmetic mean roughness of 5 nm or less on the surface opposite to the substrate 80. Thus the second transparent dielectric layer 84 that is flat contributes, along with the reflection layer 82, to the high reflectivity by suppressing the scatter and absorption of light.

The reflector mirror of the present invention can be produced similarly to that described previously by using the thin film forming apparatus shown in FIG. 1 through FIG. 3. When producing, layers can be formed on the substrate 80 continuously with one unit of thin film forming apparatus by changing the evaporation material 9 and, as required, the film forming conditions.

Figure 5:
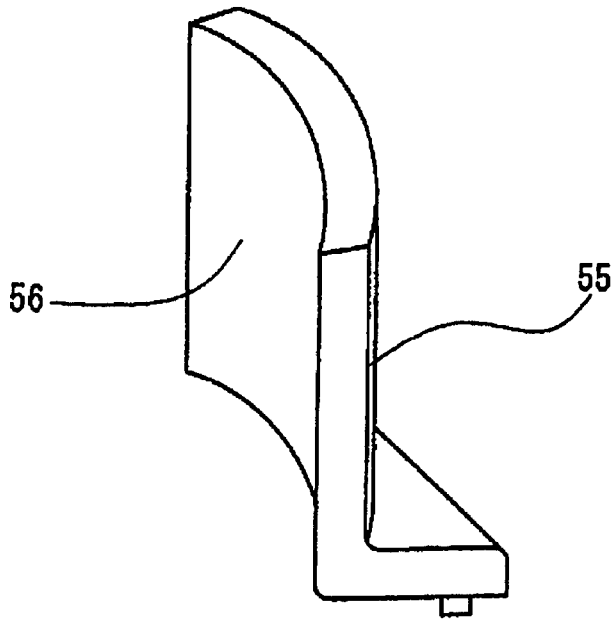
FIG. 5 is a perspective view showing an example of application of the reflector of the present invention.
Figure 6:
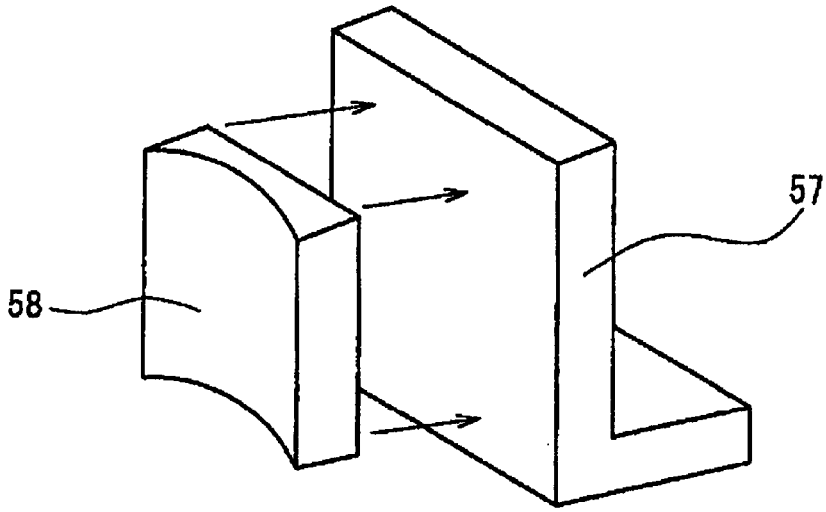
FIG. 6 PRIOR ART
FIG. 6 is a perspective view showing the reflector mirror of the prior art.

According to the present invention, there is no limitation to the shape of the substrate. Consequently, as shown in FIG. 5, a silver reflection surface 56 constituted from the layers 81 through 84 can be formed on a substrate 55 of a complicated configuration made by molding a resin. The substrate 55 also has a function of reflector mirror holding member. In contrast to the reflector mirror of the prior art in which the reflector mirror 58 is fixed on the holding member 57 as shown in FIG. 6, the present invention makes contribution also to the reduction in the number of components, the number of production steps and the production cost.

The reflector mirror of the present invention can be used preferably in various applications as exemplified below by making use of the excellent characteristics thereof.

A. Reflector mirror for liquid crystal image projector. Unlike a reflector mirror that employs the aluminum reflection layer of the prior art, it is not required to produce three kinds of mirror for each of blue light, green light and red light (three primary colors), and high reflectivity can be achieved for every color with a single reflector mirror.

B. Light tunnel for DLP projector (optical component consisting of a substrate of square tube shape of which inner surface is coated with a silver layer and a transparent dielectric layer).

C. Reflector mirror for celestial telescope and binocular.

D. Substitute using aluminum reflection layer of various optical apparatuses for reflector mirror.

E. High reflectivity mirror of special configuration consisting of a substrate that has designed surface irregularity molded thereon and is coated with an Ag reflection layer, in case the substrate is made of a plastic.

Figure 7:
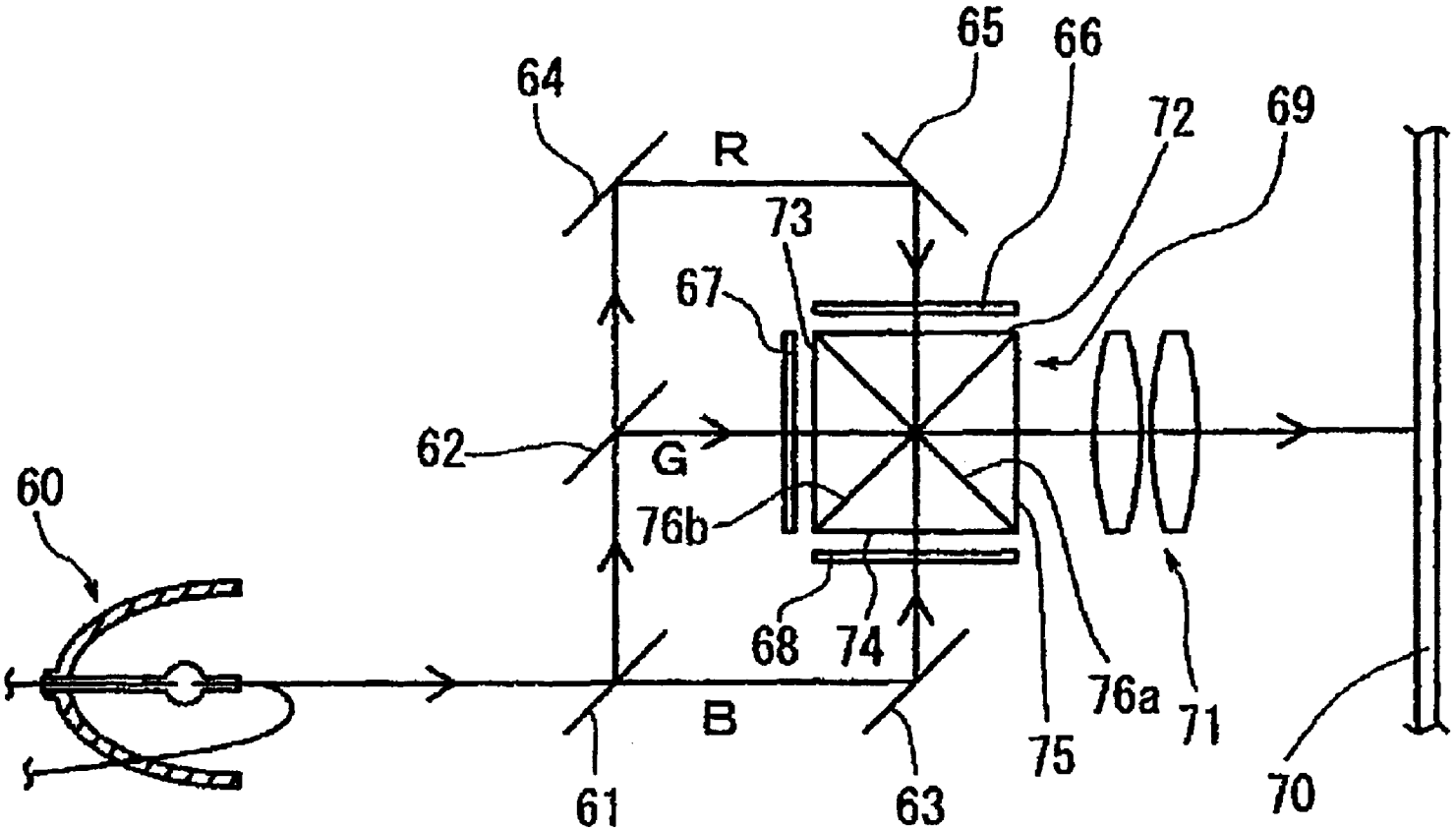
FIG. 7 is a schematic view showing an example of image projector apparatus.

An example of the liquid crystal image projector is shown in FIG. 7. The liquid crystal image projector shown in FIG. 7 is called as the transmission type color projector. This projector comprises a light source 60, first and second dichroic mirrors 61, 61 (color separators) that separates the light emitted by the light source 60 into red (R), blue (B) and green (G) light components, a plurality of reflector mirrors 63, 64, 65 that guide the light components separated by the dichroic mirrors 61, 62 through three different optical paths, first through third liquid crystal panels 66, 67, 68 (light modulators) disposed in the optical paths of the respective color components, a color prism 69 (chromatic light synthesizer) that synthesizes the images of the three colors formed on the first through third liquid crystal panels 66, 67, 68, and a projection lens unit 71 that enlarges and projects the color image, that has been synthesized by the color prism 69, onto a screen 70.

Each of the first through third liquid crystal panels 66, 67, 68 comprises a plurality of picture elements that are arranged in a plane, each picture element being driven independently from others to modulate the incident light by polarizing the light according to the input video signals and direct the light of only one polarization component to the color prism 69. The first liquid crystal panels 66 generates an image of red (R) light that has been reflected on the first dichroic mirror 61 and passed through the second dichroic mirror 62. The second liquid crystal panels 67 generates an image of green (G) light that has been reflected on the first and the second dichroic mirrors 61, 62. The third liquid crystal panels 68 generates an image of blue (B) light that has transmitted through the first dichroic mirror 61.

The color prism 69 has first through third planes of incidence 72, 73, 74 disposed to oppose the first through third liquid crystal panels 66, 67, 68, respectively, and a plane of emergence 75 that opposes the projection lens unit 71. It also has a first mirror surface 76a that reflects the incident light which has passed through the first plane of incident 72 and transmits the incident light which has passed through the second and third planes of incident 73, 74, and a second mirror surface 16b that reflects the incident light which has passed through the third plane of incident 74 and transmits the incident light which has passed through the first and second planes of incident 72, 73.

The projection lens unit 71 produces the enlarged image on the screen 70 by projecting the image emerging from the plane of emergence 75 after being synthesized by the color prism from the monochromatic images generated by the first through third liquid crystal panels 66, 67, 68.

Since the reflector mirror of the present invention has high reflectivity in the visible light region including red (R) light, green (G) light and blue (B) light, it suffices to use only one reflector mirror for the reflector mirrors 63, 64, 65 of the image projector apparatus described above, thus making contribution also to the reduction of the number of components and the production cost of the image projector apparatus.

While FIG. 7 shows the transmission type projector apparatus, the reflector mirror of the present invention can also be applied similarly to a reflection type projector apparatus, as a matter of course.

[IV] Thin Film Forming Apparatus and Thin Film Forming Method

An embodiment of the thin film forming apparatus and the thin film forming method according to the present invention is shown in FIG. 1 through FIG. 3. The thin film forming apparatus and the thin film forming method of the present invention can also be embodied in other forms. That is, in the embodiment described above, the chamber 11 is electrically floated so as to concentrate electron beam from the plasma to the evaporation material 9 held on the boat 1, and the formation of thin film on the inner wall of the chamber 11 is controlled. However, in case a decrease in the efficiency to a certain extent does not pose a problem, the chamber 11 may also be set to the ground potential.

Also a DC bias voltage is applied by the DC voltage source 6 across the substrate holding section 2 or the high frequency shaft electrode 2A and boat 1 in the embodiment described above. However, the DC bias voltage may be applied across the chamber 11 and the substrate holding section 2 or the high frequency shaft electrode 2A. In this case, however, since the efficiency of supplying electron beam to the evaporation material 9 held on the boat 1 decreases, temperature of the substrate 10 or the film substrate 10A cannot be set as low as in the embodiment described above.

EXAMPLES

The following Examples and Comparative Examples further illustrate the present, but the present invention is not limited o the Examples.

Example 1

A silver film was formed in the process shown in FIG. 2 by using the thin film forming apparatus shown in FIG. 1, under the following conditions.

Substrate 10: A glass sheet 3 mm in thickness.

Evaporation material 9: Silver.

Gas introduced into the chamber 11: Argon gas.

Power supplied from the high frequency power source 5 to the substrate holding section 2: 85 mW/cm$^2$ (power supplied per unit area of the substrate holding section 2) at frequency 13.56 MHz.

DC voltage source 6: Cathode connected to the substrate holding section 2 and anode connected to the boat 1.

Voltage applied by the DC voltage source 6 to the substrate holding section 2: 230 V.

Chamber 11: Electrically floated without grounding.

Rate of forming the metal film: 18 Å/second.

(a) Early stage of forming metal film (period T2 shown in FIG. 2)

Pressure in the chamber 11: Constant at $2\times10^{-2}$ Pa.

Current supplied from the heating power source 3 to the boat 1: 280 A (at end of period T2).

(b) Metal film forming period (period T3 in FIG. 2)

Pressure in the chamber 11: Constant at $2\times10^{-2}$ Pa.

Current supplied from the heating power source 3 to the boat 1: 210 A (at end of period T3)

A silver film 1500 Å in thickness could be formed on the surface of the substrate 10 under the conditions described above. The fact that the thermal seal having characteristic responding temperature at 40° C. showed a slight response indicated that the substrate 10 was maintained at a temperature in a range from 40 to 45° C. throughout the entire period of farming the silver film.

Comparative Example 1

Figure 8:
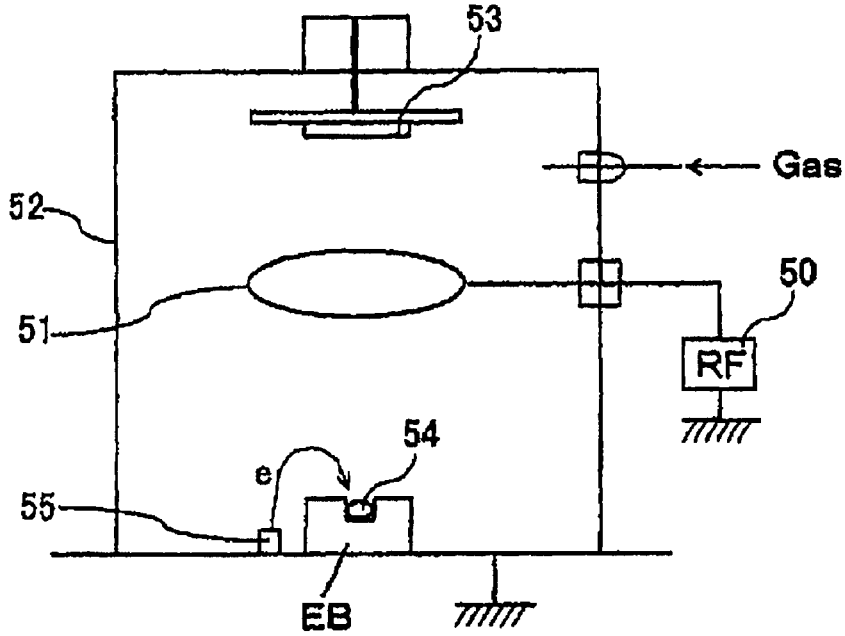
FIG. 8 PRIOR ART
FIG. 8 is a schematic view showing a conventional ion plating apparatus used for forming a metal film in Comparative Example 1.

A silver film 1500 Å in thickness was formed on a substrate 53 (glass sheet 3 mm in thickness) with an ordinary ion plating apparatus shown in FIG. 8. This apparatus was arranged so as to form plasma in the vicinity of an antenna 51 connected to a high frequency power supply 50 (output power 400 W at frequency 13.56 MHz). Argon gas was introduced into the chamber 52 of which pressure was set to $2\times10^{-2}$ Pa. The substrate 53 and the chamber 52 were grounded at the same potential, while a silver film was formed on the surface of the substrate 53 with self-bias setup. Silver that was used as the evaporation material 54 was evaporated by the irradiation of electron beam from an electron gun 55.

Comparative Example 2

Figure 9:
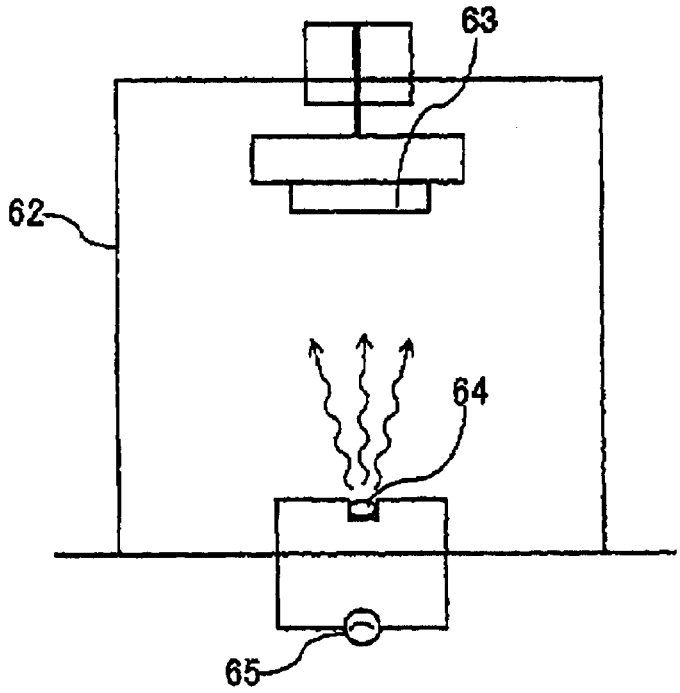
FIG. 9 PRIOR ART
FIG. 9 is a schematic view showing a vacuum vapor deposition apparatus of resistive heating system used in forming the metal film of Comparative Example 2.

A silver film 1500 Å in thickness was formed on a substrate 63 (glass sheet 3 mm in thickness) with an ordinary vacuum vapor deposition apparatus of resistive heating system shown in FIG. 9. This apparatus was arranged so as to evaporate an evaporation material 64 (silver) by heating with current of 320 A supplied from an AC power source 65 thereby to deposit on a substrate 63 in a chamber 62 of which inner pressure was set to $2\times10^{-2}$ Pa.

(Evaluation Test)

Evaluation tests were conducted on the silver films obtained in Example 1 and Comparative Examples 1, 2.

1. Surface Roughness of Silver Film

Surfaces of the silver films 1500 Å in thickness formed as described above were observed with an atomic force microscope (Nano Scope II manufactured by Digital Instruments Inc.), to take an image of the surface irregularity with an accuracy on the order of nanometers and determine the arithmetic mean surface roughness (Ra). Value of Ra was 2 nm or lower for the silver film of Example 1, and 3 to 5 nm in both cases of Comparative Examples 1 and 2.

2. (111) Peak Intensity of X-Ray Diffraction

An X-ray diffraction analyzer (RINT1400 manufactured by Rigaku Denki Co.) was used to measure with X-ray output of 200 mA at 50 kV, measuring angle range 2θ from 10 to 100° and aperture of 1° for emission slit, 1° for scattering slit and 0.3 mm for receiving slit. As a result, the silver film of Example 1 (111) showed peak intensity of X-ray diffraction not less than 20 times the sum of all other peaks, while 2 to 15 times in the case of the silver films of Comparative Examples 1 and 2.

3. Reflectivity (1) Measurement of Reflectivity in Visible Light Region

Reflectivity in the visible light region (approximately 400 to 700 nm) was measured with a photometer (spectrophotometer U-4000 manufactured by Hitachi Limited). As a result, the silver film of Example 1 showed reflectivity of a value different by 0.2% or less from the theoretical value of pure metal. The difference was within 2% for both silver films of Comparative Examples 1 and 2. Theoretical value was determined from the refractive index of pure silver shown in a list of fundamental physical properties (pp 128–131 (Ag), published by Kyoritsu Publishing Co., Ltd. on May 15, 1972).

(2) Change in Reflectivity

Change in reflectivity was measured with the same photometer as that of the measurement (1) in a range of incident angles of light from 10 to 50°. Change in reflectivity was within 0.5% for the silver film of Example 1, and 5% or larger for both the silver films of Comparative Examples 1 and 2.

(3) Reflectivity of Light in Wavelength Range from 250 to 400 nm

Reflectivity of light in wavelength range from 250 to 400 nm was measured with the same photometer as that of the measurement (1). The silver film of Example 1 showed reflectivity of a value different by 0.5% or less from the theoretical value of pure metal. Both the silver films of Comparative Examples 1 and 2 showed the difference from 10 to 15%. Theoretical value was determined from the reflectivity of pure silver shown in a list of fundamental physical properties mentioned above.

4. Environment Durability

Surface of the silver film was observed after the film had been held at temperature of 50° C. and humidity of 95% for 24 hours according to MIL-M-13508. While the silver film of the Example did not show white clouding on the surface, both the silver films of Comparative Examples 1 and 2 showed white clouding.

5. Bonding Characteristic

Bonding characteristic was examined by conducting the tape test specified in MIL-M-13508. While the silver film of the Example did not experience peel off, the silver films of Comparative Examples 1 and 2 easily peeled off.

Test Example 1

(Production of Aluminum Film)

Al films about 1100 Å in thickness were formed on the surfaces of substrates 10 made of glass (G), polycarbonate (PC) and polymethyl methacrylate (PM) by the method of Comparative Example 1 (A), method of Comparative Example 2 (B) and method of Example 1 (C) under the following conditions.

A) Film is formed by the ion plating process of the prior art in the same manner as in Comparative Example 1, except for using aluminum instead of silver for the evaporation material and changing the high frequency output power from 400 W to 380 W.

B) Film is formed by the resistive heating process of the prior art in the same manner as in Comparative Example 2, except for using aluminum instead of silver for the evaporation material and changing the rate of forming the thin film from 18 Å/second to 15 Å/second.

C) Film is formed according to the present invention in the same manner as in Example 1, except for using aluminum instead of silver for the evaporation material and changing the high frequency output power and the rate of forming the thin film from 85 mW/cm$^2$ and 18 Å/second to 80 mW/cm$^2$ and 15 Å/second.

Figure 10:
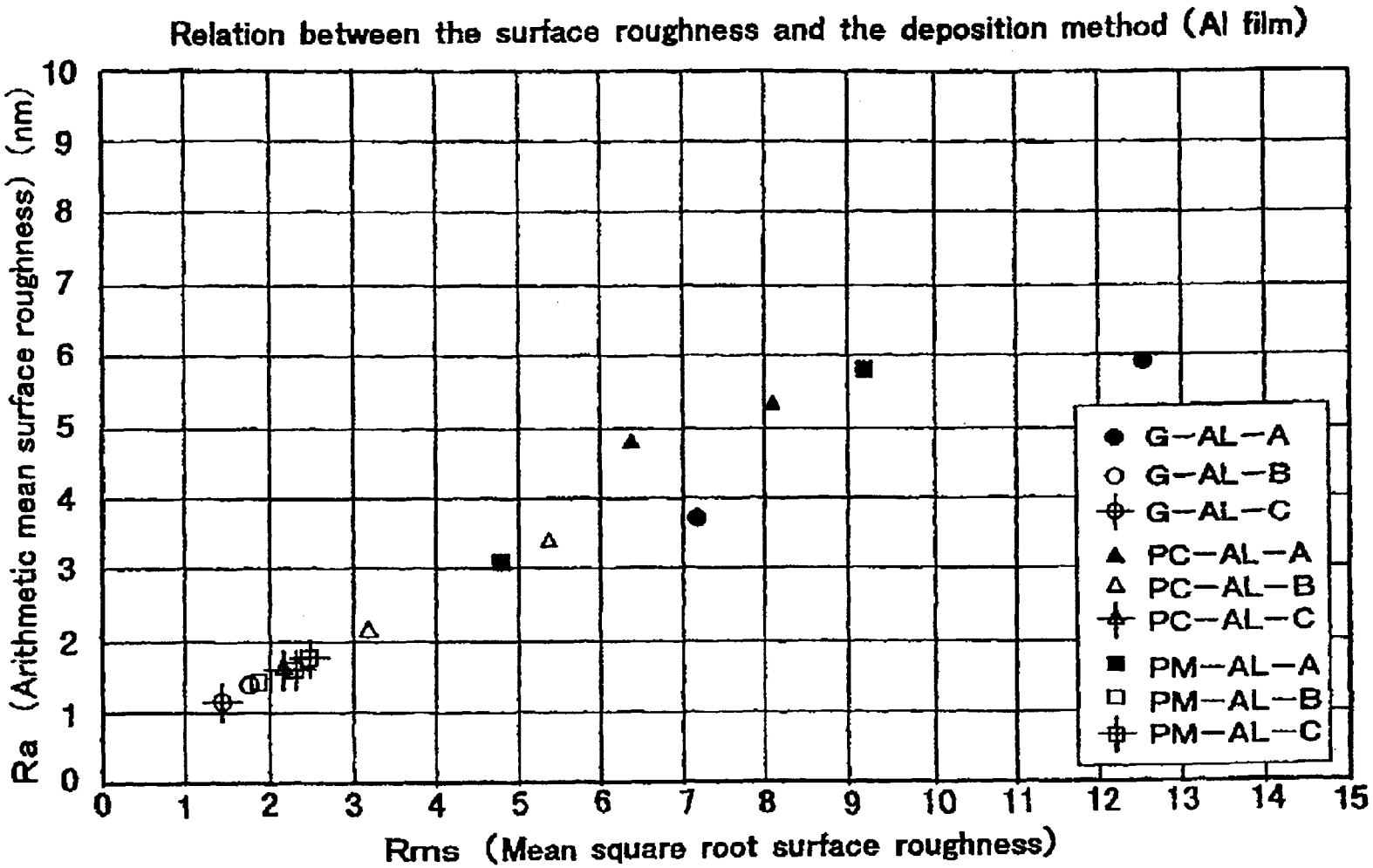
FIG. 10 is a graph showing the relation between the surface roughness and the deposition method for each Al film obtained in Test Example 1.

(1) Surface roughness was measured by the method described previously on each of the samples obtained. Results are shown in FIG. 10. Each sample is identified as, for example, "G-AL-A" that means an aluminum (AL) film was formed on the surface of a glass (G) substrate 10 by the method of Comparative Example 1 (A)

Figure 11:
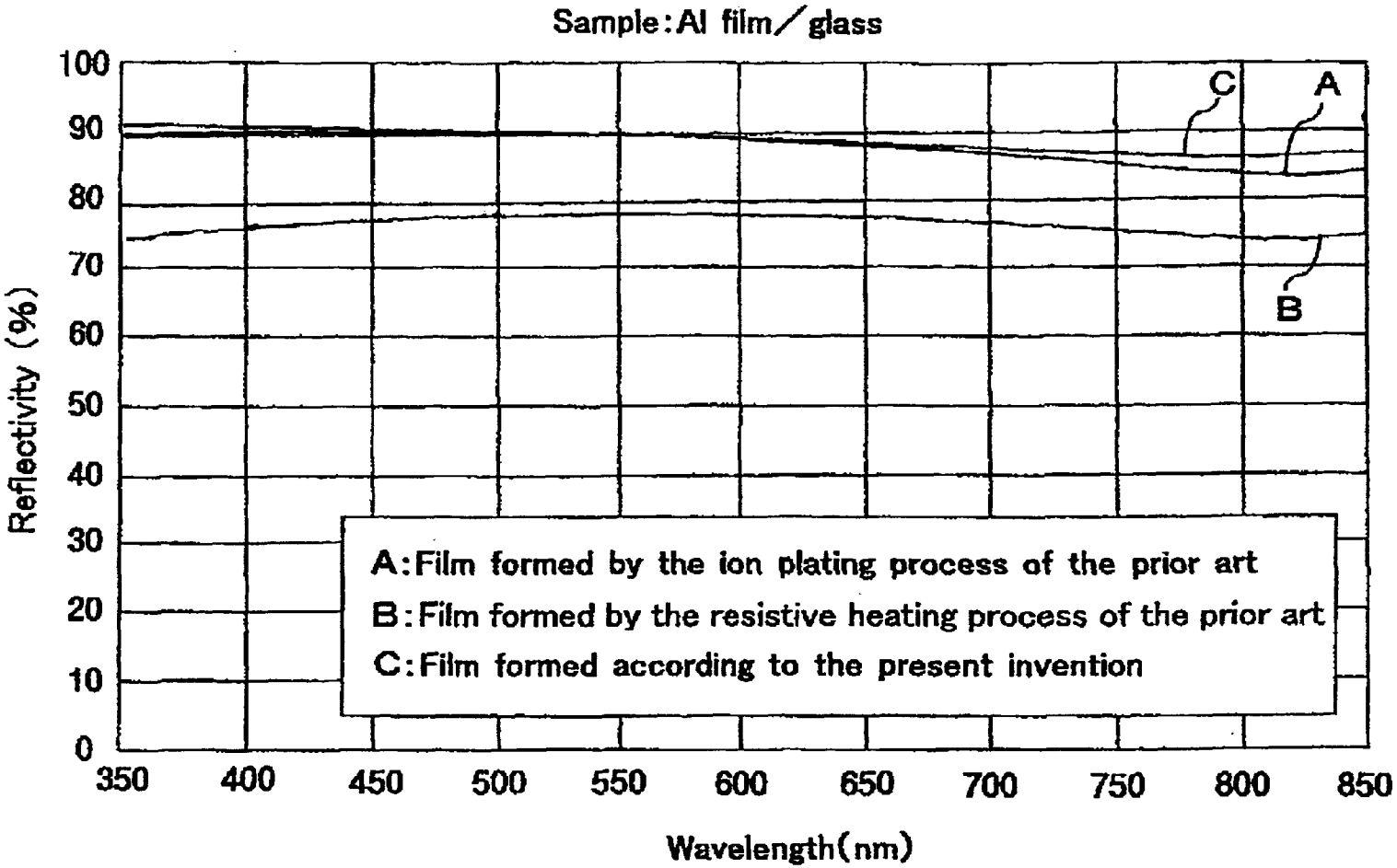
FIG. 11 is a graph showing the reflectivity of each Al film/glass substrate obtained in Test Example 1.
Figure 12:
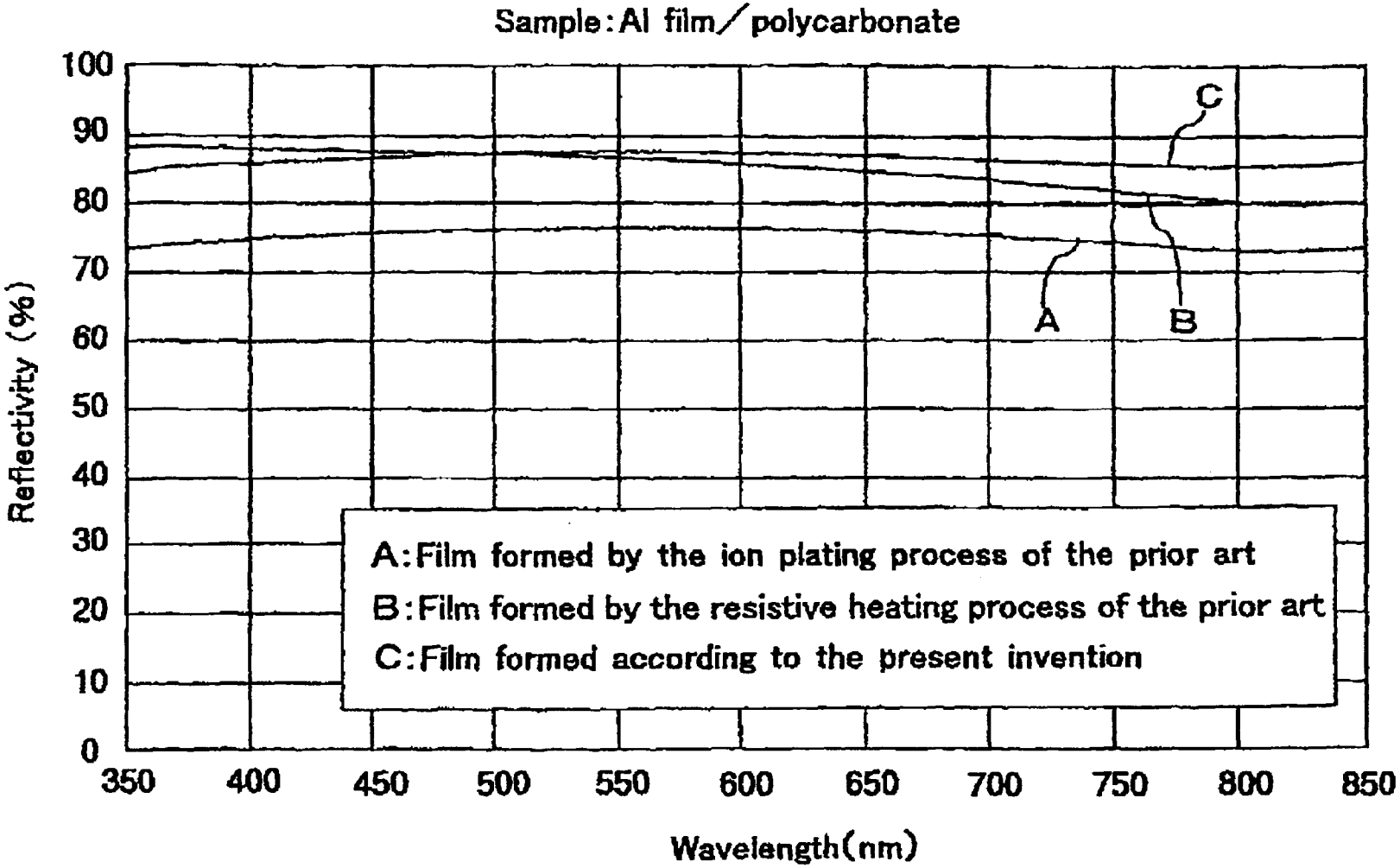
FIG. 12 is a graph showing the reflectivity of each Al film/polycarbonate substrate obtained in Test Example 1.
Figure 13:
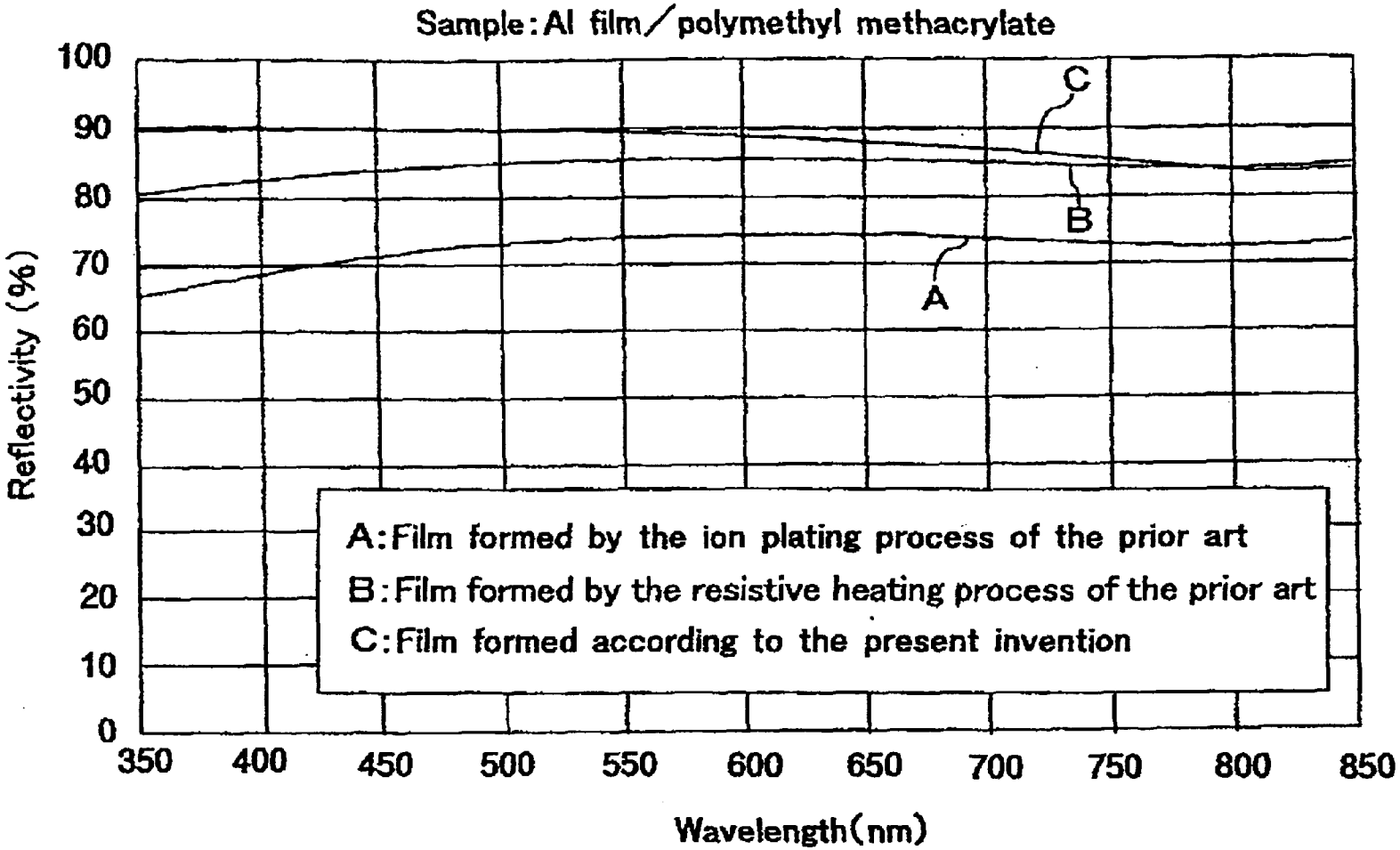
FIG. 13 is a graph showing the reflectivity of each Al film/polymethyl methacrylate substrate obtained in Test Example 1.

(2) Results of measuring the reflectivity of the samples are shown in FIG. 11 through FIG. 13.

Figure 14:
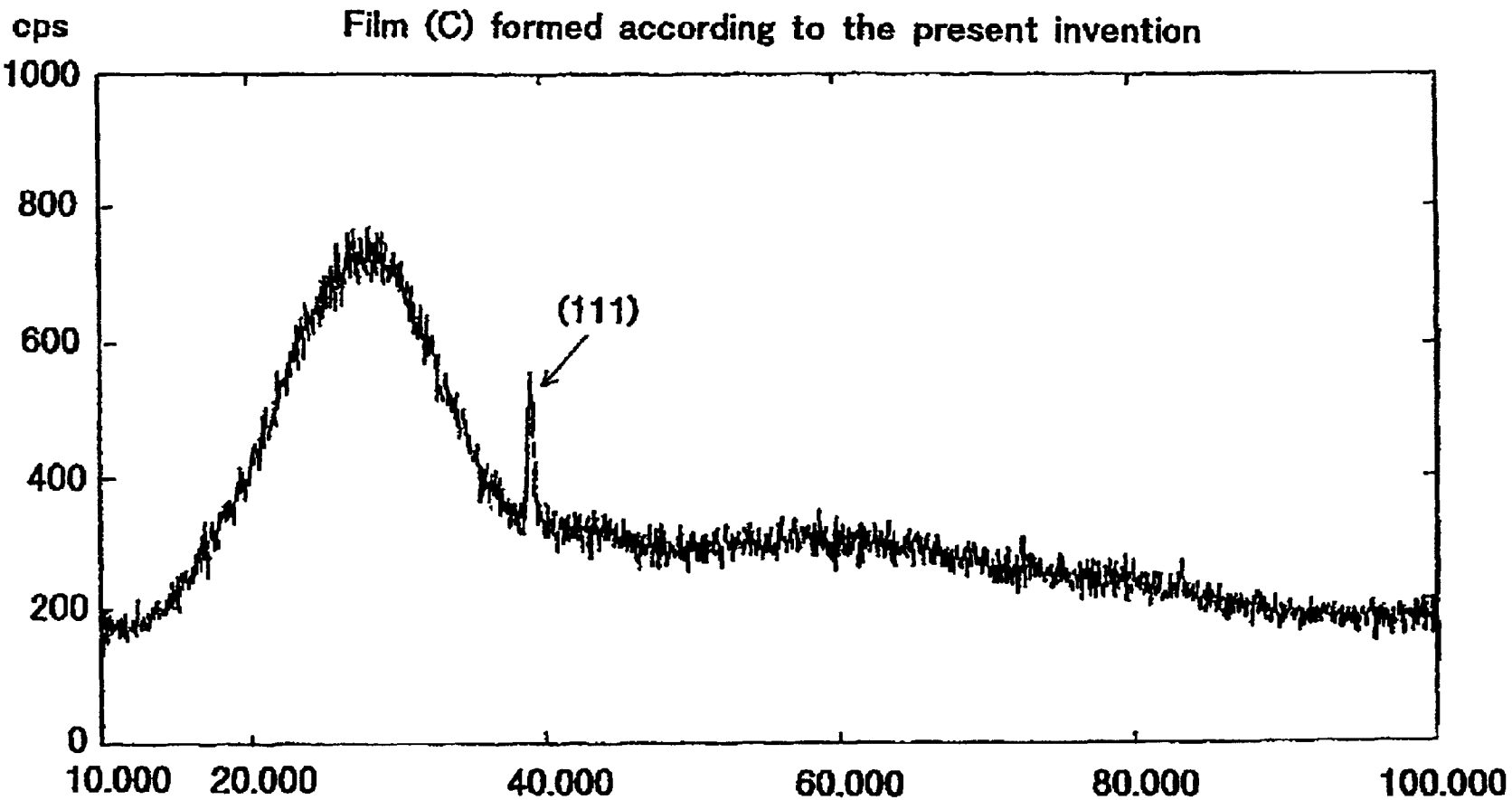
FIG. 14 is a graph showing the results of X-ray diffraction analysis of the Al film (film C of the invention) obtained in Test Example 1 by employing the method of Example 1.
Figure 15:
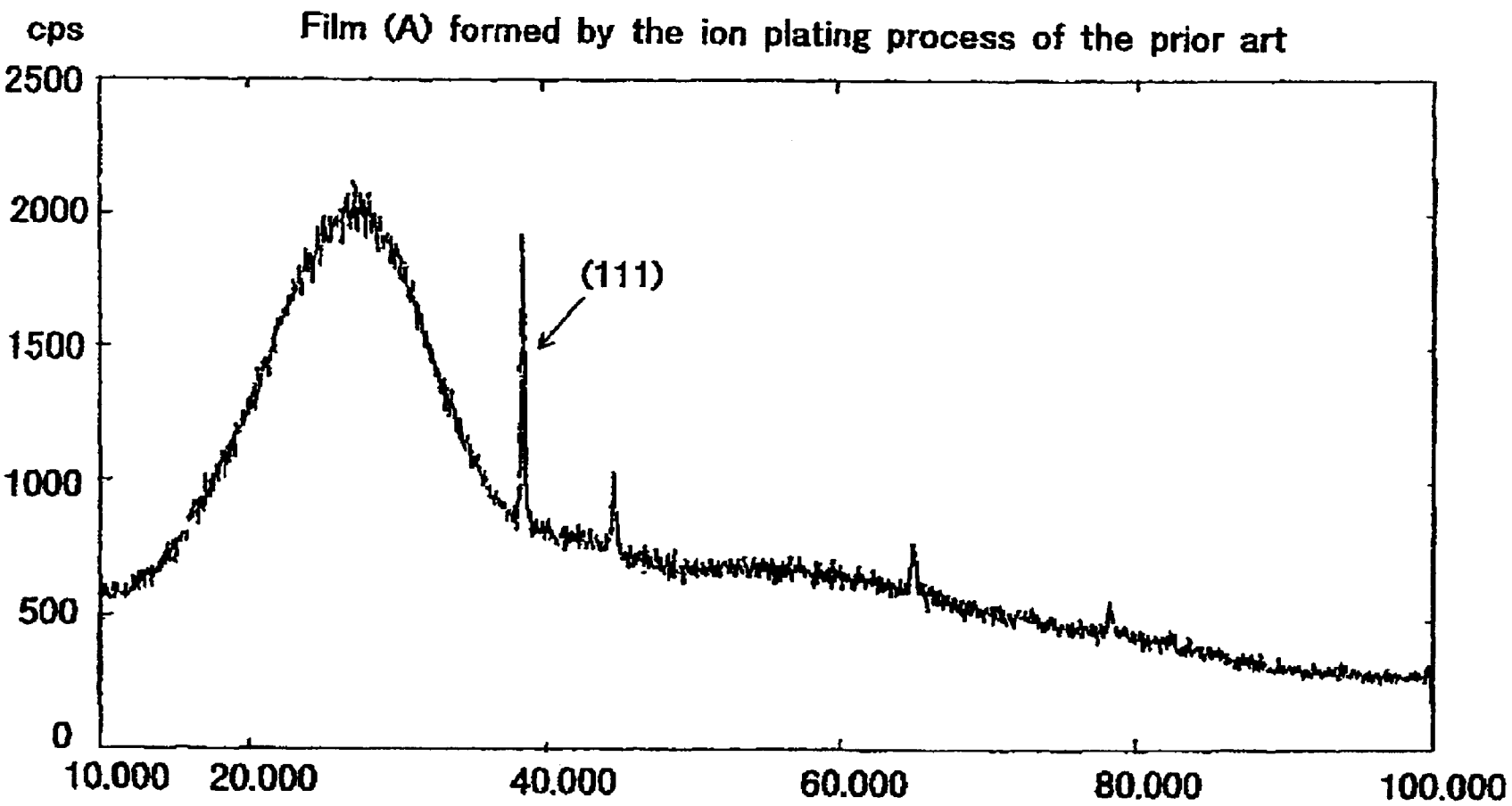
FIG. 15 is a graph showing the results of X-ray diffraction analysis of the Al film (film A made by ion plating of the prior art) obtained in Test Example 1 by employing the method of Comparative Example 1.
Figure 16:
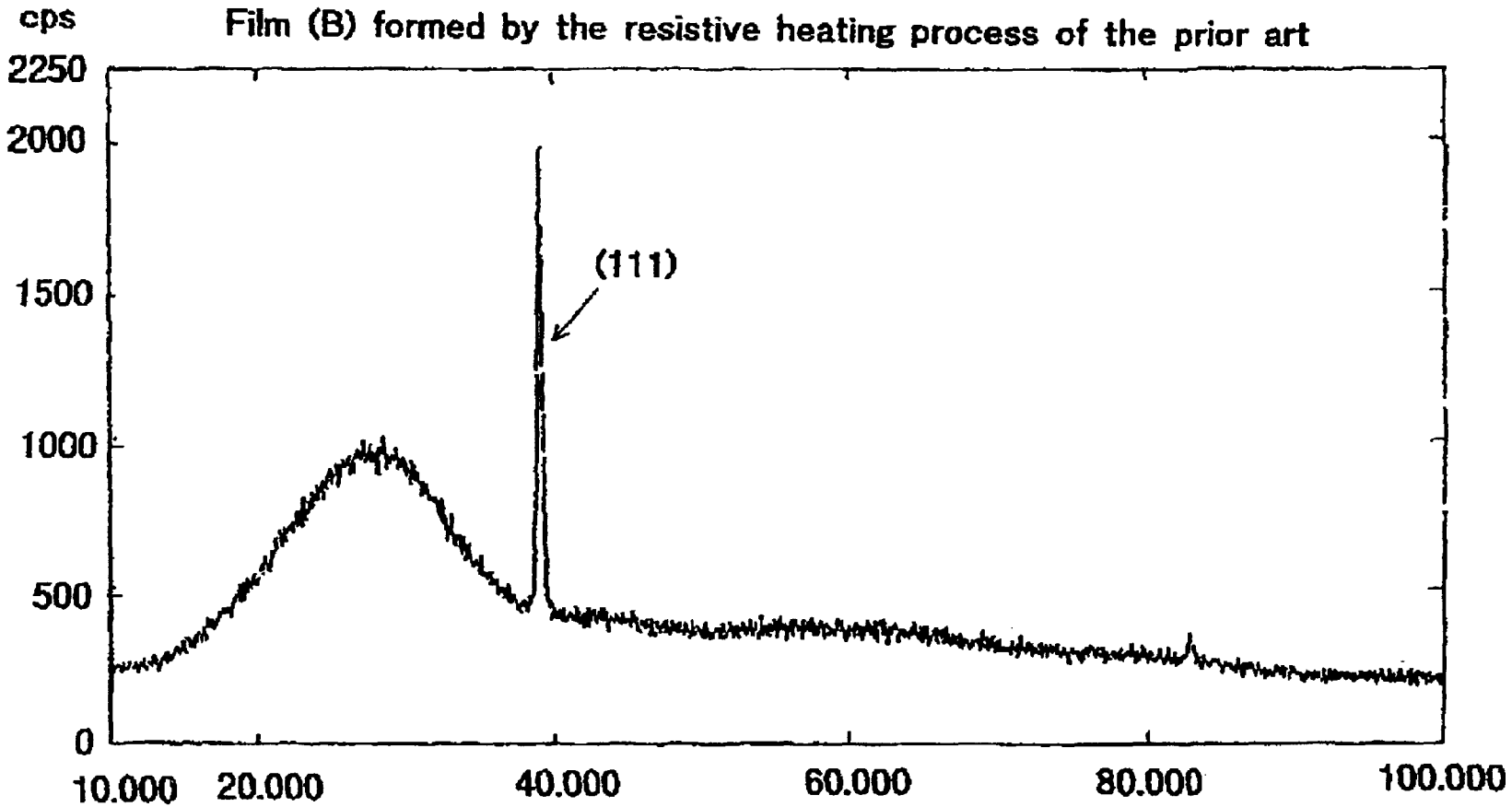
FIG. 16 is a graph showing the results of X-ray diffraction analysis of the Al film (film B made by resistive heating of the prior art) obtained in Test Example 1 by employing the method of Comparative Example 2.

(3) Results of X-ray diffraction analysis on the Al films obtained by the method of Example 1 (C), the method of Comparative Example 1 (A) and the method of Comparative Example 2 (B) are shown in FIG. 14 through FIG. 16.

Test Example 2

(Production of Copper Film)

Cu films about 1300 Å in thickness were formed on the surfaces of substrates 10 made of glass (G), polycarbonate (PC) and polymethyl methacrylate (PM) by the method of Example 1 (C), method of Comparative Example 1 (A) and method of Comparative Example 2 (B) similarly to Test Example 1 under the following conditions.

A) Film is formed by the ion plating process of the prior art in the same manner as in Example 1, except for using copper instead of silver for the evaporation material and changing the high frequency output power and the rate of forming the thin film from 400 W and 18 Å/second to 420 W and 12 Å/second.

B) Film is formed by the resistive heating process of the prior art in the same manner as in Comparative Example 2, except for using copper instead of silver for the evaporation material and changing the rate of forming the thin film from 18 Å/second to 12 Å/second.

C) Film is formed according to the present invention in the same manner as in Example 1, except for using copper instead of silver for the evaporation material and changing the high frequency output power and the rate of forming the thin film from 85 mW/cm$^2$ and 18 Å/second to 88 mW/cm$^2$ and 12 Å/second.

Figure 17:
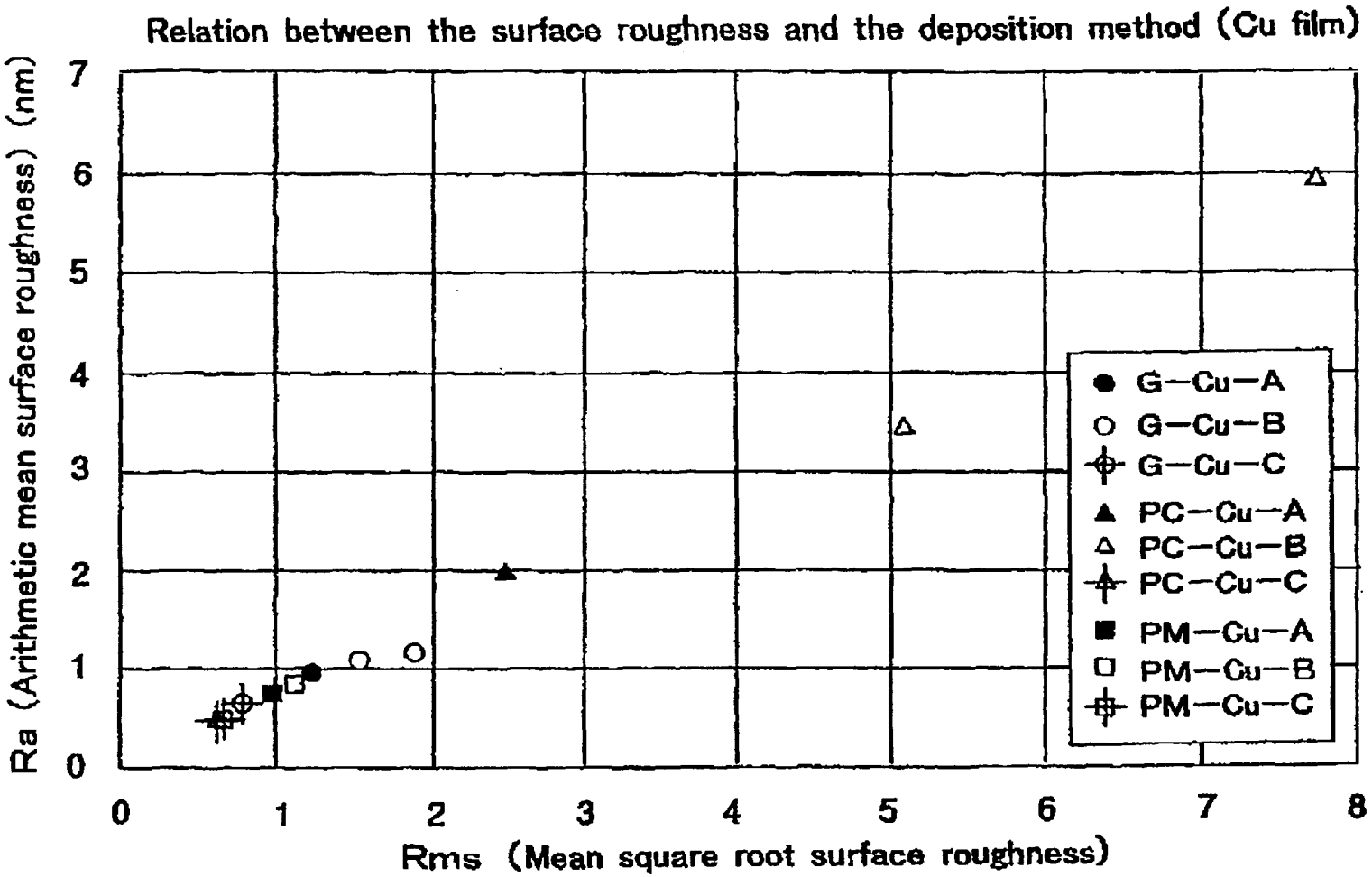
FIG. 17 is a graph showing the relation between the surface roughness and the deposition method for each Cu film obtained in Test Example 2.

(1) Surface roughness was measured by the method described previously on each of the samples obtained. Results are shown in FIG. 17. The sample is identified as, for example, "G-Cu-A" that means a copper (Cu) film was formed on the surface of a glass (G) substrate 10 by the method of Comparative Example 1 (A).

Figure 18:
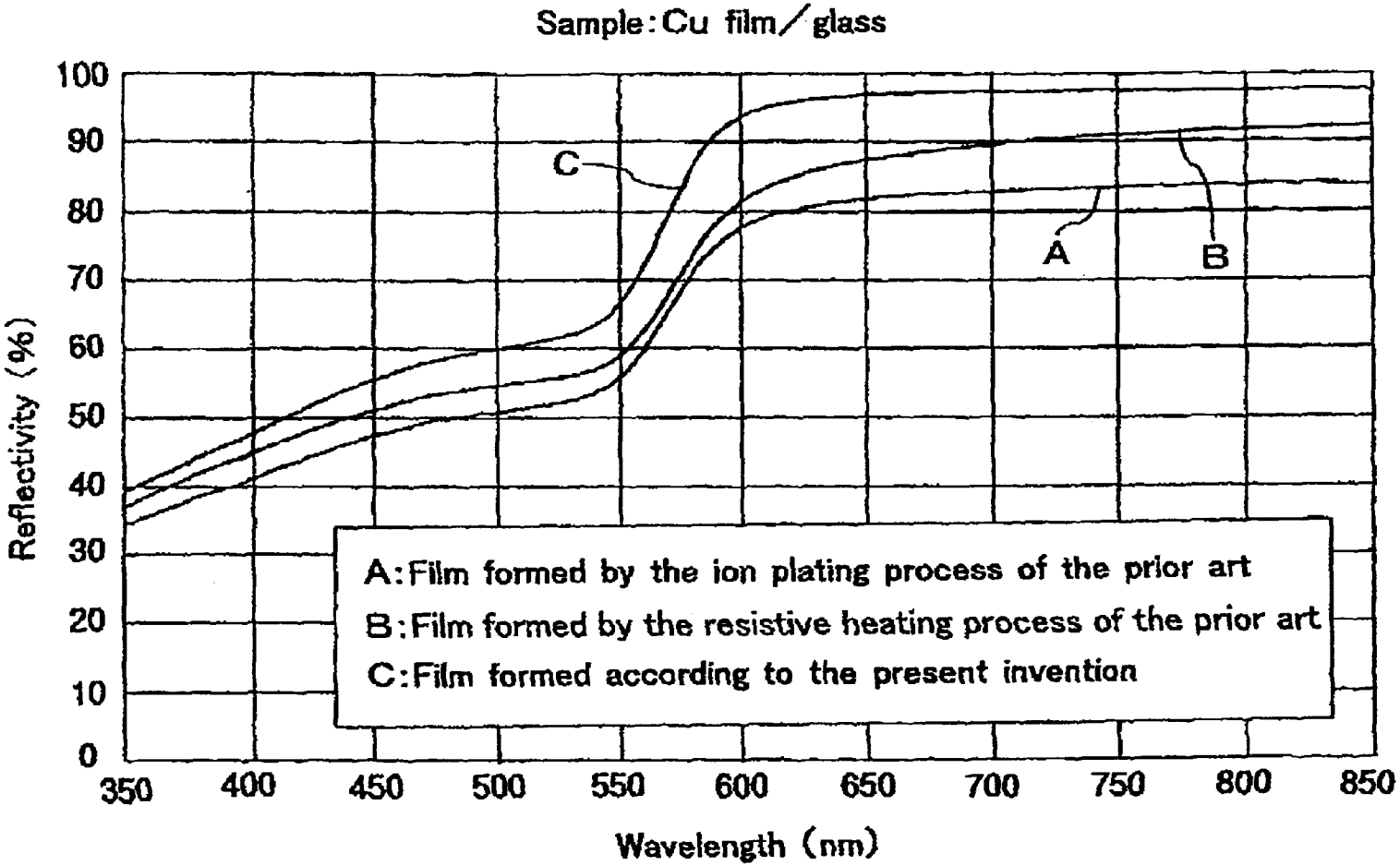
FIG. 18 is a graph showing the reflectivity of each Cu film/glass substrate obtained in Test Example 2.
Figure 19:
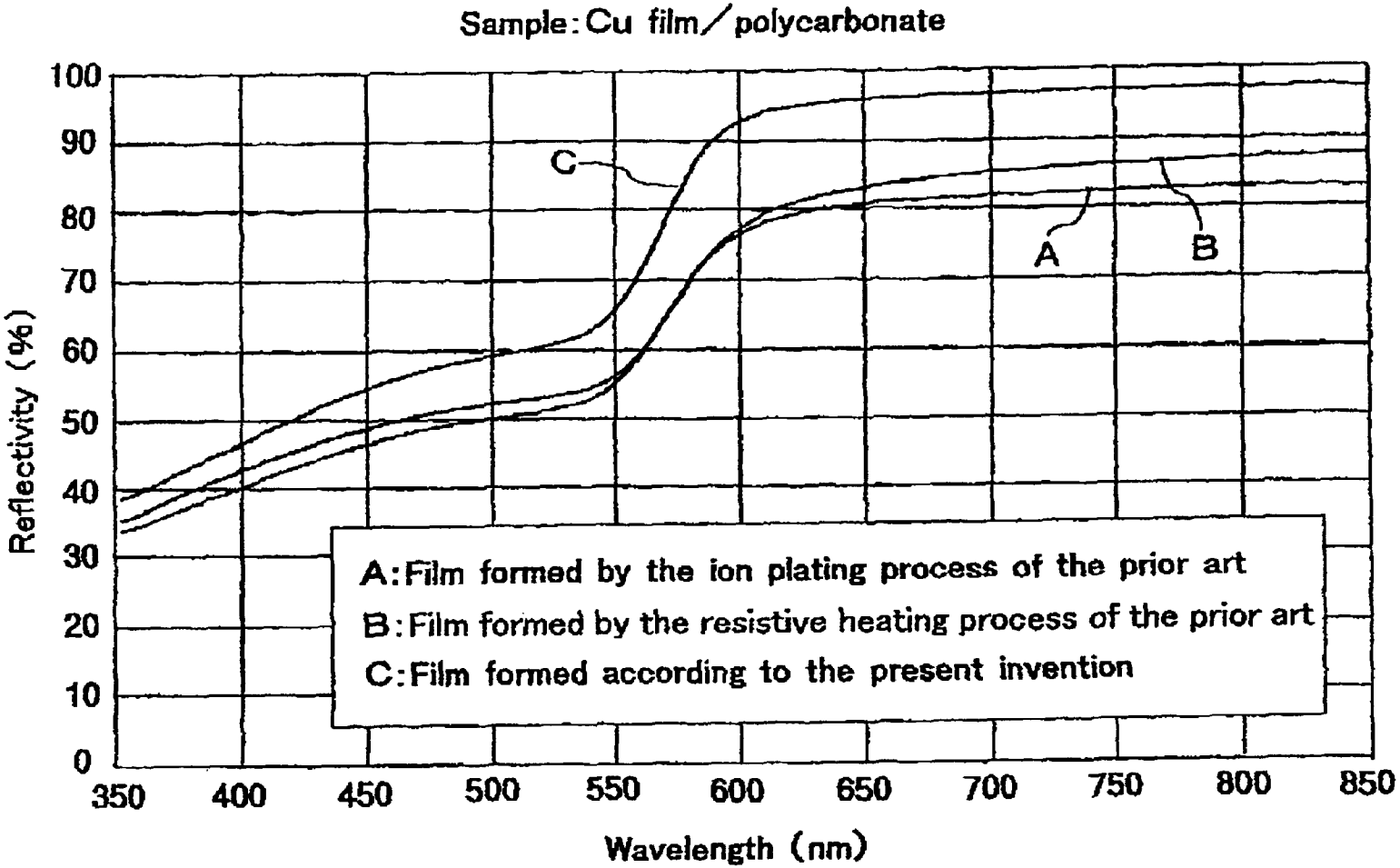
FIG. 19 is a graph showing the reflectivity of each Cu film/polycarbonate substrate obtained in Test Example 2.
Figure 20:
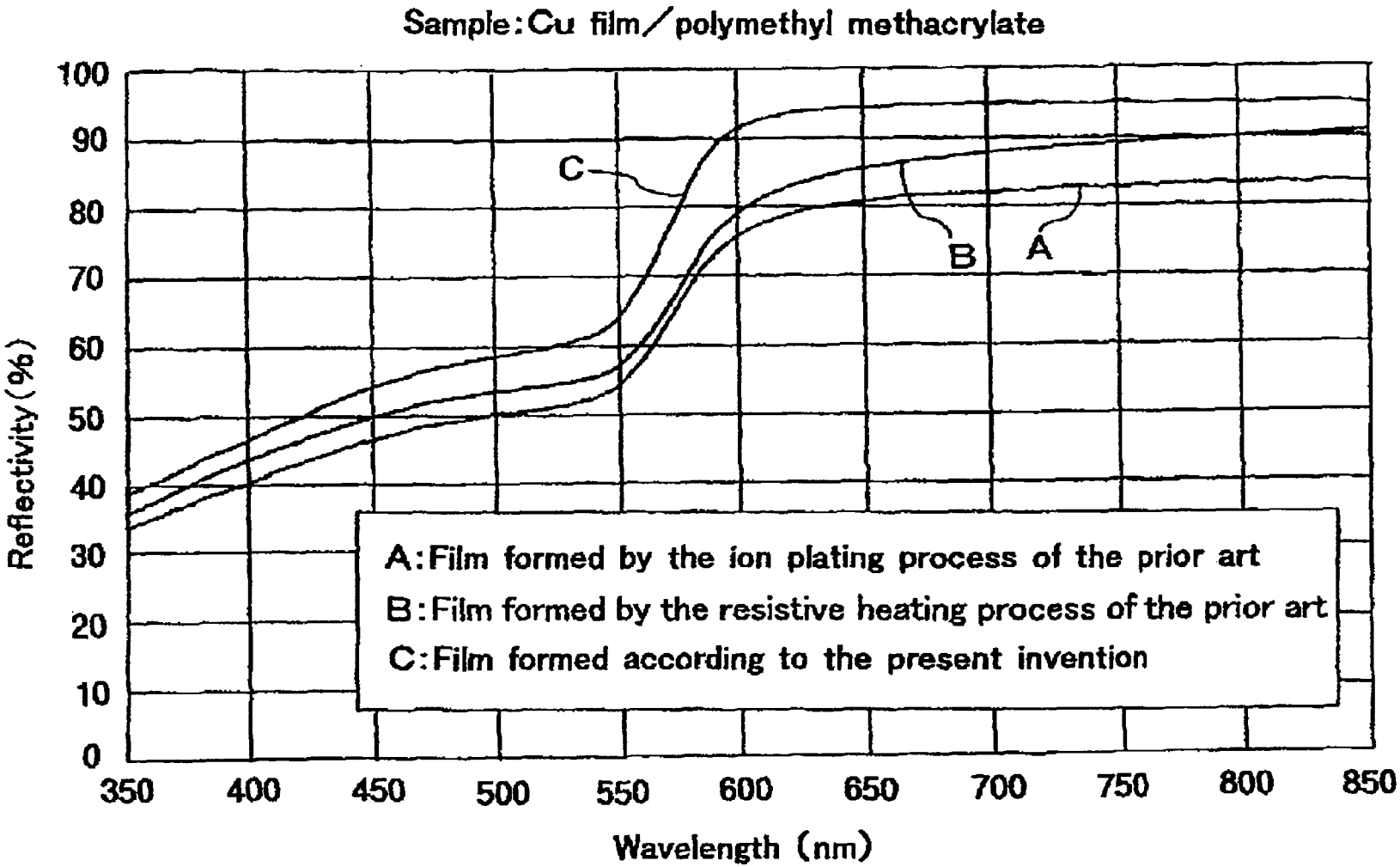
FIG. 20 is a graph showing the reflectivity of each Cu film/polymethyl methacrylate substrate obtained in Test Example 2.

(2) Results of measuring the reflectivity of the samples are shown in FIG. 18 through FIG. 20.

Figure 21:
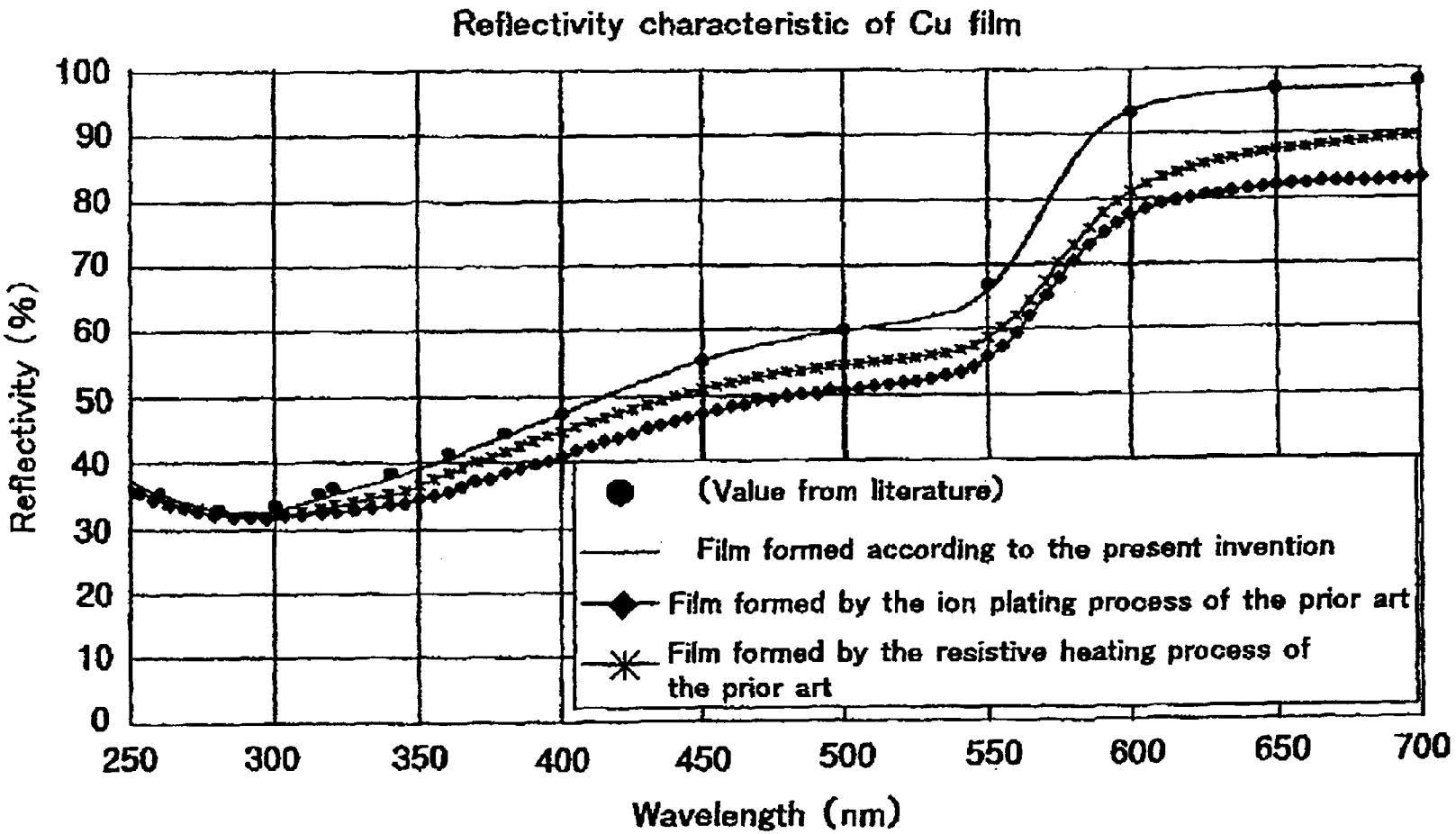
FIG. 21 is a graph showing the reflectivity characteristic over a range of wavelengths from 250 to 700 nm of light in the same graph format as that of FIG. 18, obtained in Test Example 2.

(3) FIG. 21 is a reflectivity curve for light of wavelengths ranging from 250 to 700 nm in the same format as the graph of FIG. 18. Value from literature in the drawing refers to value given in the above-mentioned list of fundamental physical properties, pp 422–429 (copper).

Example 2

(Formation of Chromium Oxide)

A chromium oxide film was formed in the process shown in FIG. 2 by using the thin film forming apparatus shown in FIG. 1, under the following conditions.

Substrate 10: A glass sheet 3 mm in thickness.

Evaporation material 9: Chromium (purity 99.9%).

Gas introduced into the chamber 11: Argon gas and oxygen gas.

Power supplied from the high frequency power source 5 to the substrate holding section 2: 85 mW/cm$^2$ (power supplied per unit area of the substrate holding section 2) at frequency 13.56 MHz.

DC voltage source 6: Cathode connected to the substrate holding section 2 and anode connected to the boat 1.

Voltage applied by the DC voltage source 6 to the substrate holding section 2: 230 V.

Chamber 11: Electrically floated without grounding.

Rate of forming the metal oxide film: 15 Å/second.

(A) Early Stage of Forming Metal Oxide Film (Period T2 Shown in FIG. 2)

Pressure in the chamber 11: Constant at $2\times10^{-2}$ Pa.

Current supplied from the heating power source 3 to the boat 1: 350 A (at end of period T2).

(B) Metal Oxide Film Forming Period (Period T3 in FIG. 2)

Pressure in the chamber 11: Constant at $2\times10^{-2}$ Pa.

Current supplied from the heating power source 3 to the boat 1: 230 A (at end of period T3).

A chromium oxide film 1500 Å in thickness could be formed on the surface of the substrate 10 under the conditions described above. The fact that the thermal seal having characteristic responding temperatures of 40° C. or higher did not show a response indicated that the substrate 10 was maintained at temperatures below 40° C. throughout the entire period of forming the thin silver film.

Comparative Example 3

A chromium oxide film 1500 Å in thickness was formed on the surface of a substrate 53 (glass sheet 3 mm in thickness) with an ordinary ion plating apparatus shown in FIG. 8 (output power 400 W at frequency of 13.56 MHz). This apparatus was arranged so that argon gas and oxygen gas are introduced into the chamber 52 of which pressure was set to $2\times10^{-2}$ Pa. The substrate 53 and the chamber 52 are grounded at the same potential, while a chromium oxide film was formed on the surface of the substrate 53 with self-bias setup. The evaporation material 54 (chromium) was evaporated by the irradiation of electron beam from the electron gun 55.

Comparative Example 4

A chromium oxide film 1500 Å in thickness was formed on the surface of a substrate 63 (glass sheet 3 mm in thickness) with an ordinary vacuum vapor deposition apparatus of resistive heating system shown in FIG. 9. An evaporation material 64 (chromium oxide) was heated with heating current 350 A supplied from an AC power source 65 so as to evaporate and deposit on the substrate 63 in a chamber 62 of which pressure was set to $2\times10^{-2}$ Pa.

(Evaluation Test)

The following evaluation tests were conducted on the chromium oxide film obtained in Example 2 and Comparative Examples 3, 4.

1. Degree of Oxidation of Chromium Oxide Film (1-1) Measuring Method

X-ray diffraction peaks of chromium oxide and metal chromium (Cr2p) were measured for the chromium oxide films 1500 Å in thickness that were formed, with an X-ray photoelectron spectroscope, and determined the molar ratio from the ratio of areas of the diffraction peaks of chromium oxide and metal chromium. With the diffraction peak area of chromium oxide denoted as Crp and the diffraction peak area of non-oxidized chromium denoted as Cr2p, the molar ratio was determined from Cr2p/Crp and calculated the content of non-oxidized chromium.

(1-1) Results of Measurement

Content of non-oxidized chromium in the chromium oxide film of Example 2 was lower than 0.1 mole % that was the measurement limit.

Content of non-oxidized chromium in the chromium oxide film of Comparative Example 3 was about 5 mole %, and content of non-oxidized chromium in Comparative Example 4 was about 40 mole %.

These results show that oxygen defect in the chromium oxide film of Example 2 is far smaller than in the cases of Comparative Examples 3 and 4.

2. Bonding with the Substrate (2-1) Measuring Method

Abrasion test was conducted according to the MIL standard MIL-C-48497A. Specifically, a coated surface was rubbed with a standard eraser rubber for abrasion test in conformity with the standard (MIL-E-12397) under a load of 2 pounds, according to the procedure of "Strict abrasion test method" (chapter 4.5.5.1 of MIL-C-48497A).

(2-1) Results of Measurement

Several scratches and trace of rubbing by the eraser rubber were observed on the chromium oxide film of Example 2 after 120 rubbing strokes in average (number of samples: 2).

On the other hand, many scratches were observed on the samples of Comparative Example 2 after 20 rubbing strokes, and many scratches were observed on the samples of Comparative Example 3 after 10 rubbing strokes.

These results show that the chromium oxide film of Example 2 is superior to those of Comparative Examples 3 and 4 in bonding performance and durability.

3. Insulation Resistance (3-1) Measuring Method

Insulation resistance of the chromium oxide film was measured with an insulation tester.

(3-2) Results of Measurement

The chromium oxide film of Example 2 showed resistance above the measurement limit of 1 GΩ, while the sample of Comparative Example 3 showed 200 to 300 kΩ and the sample of Comparative Example 4 showed 25 to 30 Ω. These results show that the chromium oxide film of Example 2 has higher resistance than those of Comparative Examples 3 and 4.

Example 3

(Formation of Titanium Oxide Film)

Titanium oxide film was formed on the surface of a substrate so that an equation: $n\times d=3\lambda_0/4$ (n is refractive index of titanium oxide, d is thickness of titanium oxide film and $\lambda_0$=580 nm) is satisfied , in the same manner as in Example 2, except for using titanium as the evaporation material and changing the output power of the high frequency power source 5 to 78 mW/cm$^2$.

1. Transmittance and Reflectivity

Figure 22:
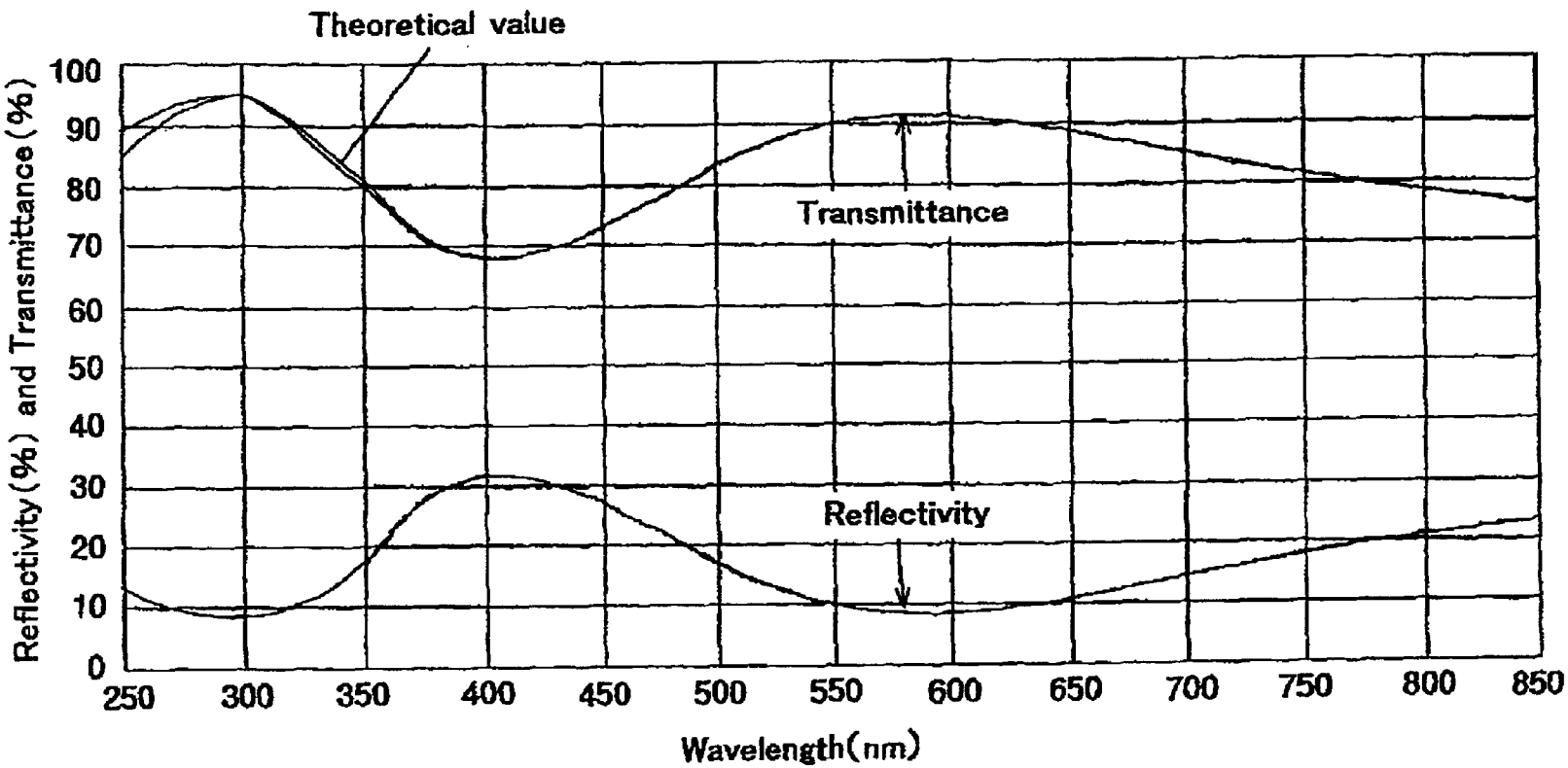
FIG. 22 is a graph showing the transmittance and reflectivity of a titanium oxide film of Test Example 2.

Transmittance and reflectivity of the titanium oxide film obtained in Example 3 were measured with a photometer (spectrophotometer U-4000 manufactured by Hitachi Limited). The results are shown in FIG. 22. As shown in FIG. 22, transmittance was almost equal to the theoretical value of pure titanium oxide. Theoretical values were the refractive index shown in the list of fundamental physical properties (published by Kyoritsu Publishing Co., Ltd. on May 15, 1972) and the value of reflectivity calculated from the value of coating material given in a catalogue published by Optron Inc.

Difference between the value of reflectivity obtained in Example 2 and the theoretical value was 0.15% in average, and never exceeded 0.2%.

2. Packing Density

The packing density of the titanium oxide film obtained in Example 3 was measured by the humidity test, in which the metal oxide film is left to stand in an environment of 60° C. in temperature and 90% in humidity for 24 hours, to determine the change in refractive index from a change in reflectivity by measuring the change in reflectivity before and after standing in the humid atmosphere. The smaller the change in the refractive index, the greater the packing density. In the case of a coated glass sheet having refractive index of "ns", for example, reflectivity "R" is given by the following formula.

$$R=\{nf^2(1-ns)^2+(ns-nf^2)^2\cdot\tan(\delta/2)\}/\{nf^2(1+ns)^2+(ns+nf^2)^2\cdot\tan(\delta/2)\}$$

where nf: Refractive index of metal oxide film $\delta=(2\pi/\lambda)nf\cdot d\cos\theta$ $\lambda$=Wavelength of light d=Thickness of metal oxide film $\theta$=Incident angle of light Value of nf is calculated by equation $nf^2=ns(1+R^{1/2})/(1-R^{1/2})$ using the measured peak value of "R".

Refractive index of the metal oxide film can be calculated from the packing density "P" as follows.

$$nf=Pn_m+(1-P)n_v$$

where $n_m$: Refractive index of the solid portion of the metal oxide film $n_v$: Refractive index of water vapor in void which is 1.33

Value of "P" is determined from the difference of the measured value of "nf" and the theoretical value of the refractive index that is dependent on the packing density "P". The packing density of the titanium oxide film is determined as the value of "P" when the theoretical value and the measured value become equal as tentative values of, for example, 1.00, 0.99, 0.98 and so on are substituted for the value of P in the equation: $nf=Pn_m+(1-P)n_v$.

Since the change in reflectivity of the titanium oxide film of Example 3 was 0.2% or less, the packing density is estimated to be 0.98 or higher, or more exactly 0.99 or higher.

Meanwhile a titanium oxide film (Comparative Example 5) was formed in the same manner as in Comparative Example 3, except for using titanium instead of chromium for the evaporation material and setting the rate of forming the thin film to 5 Å/second. Also a titanium oxide film (Comparative Example 6) was formed in the same manner as in Comparative Example 4, except for using titanium instead of chromium for the evaporation material and setting the rate of forming the thin film to 5 Å/second.

Since the changes in reflectivity in both Comparative Examples 5 and 6 were about 3 to 6%, the packing density is estimated to be in a range from 0.85 to 0.95.

These results show that the titanium oxide film of Example 3 is denser with almost no voids included therein than those of Comparative Examples 5 and 6.

Example 4

(Production of Reflector Mirror)

Figure 4:
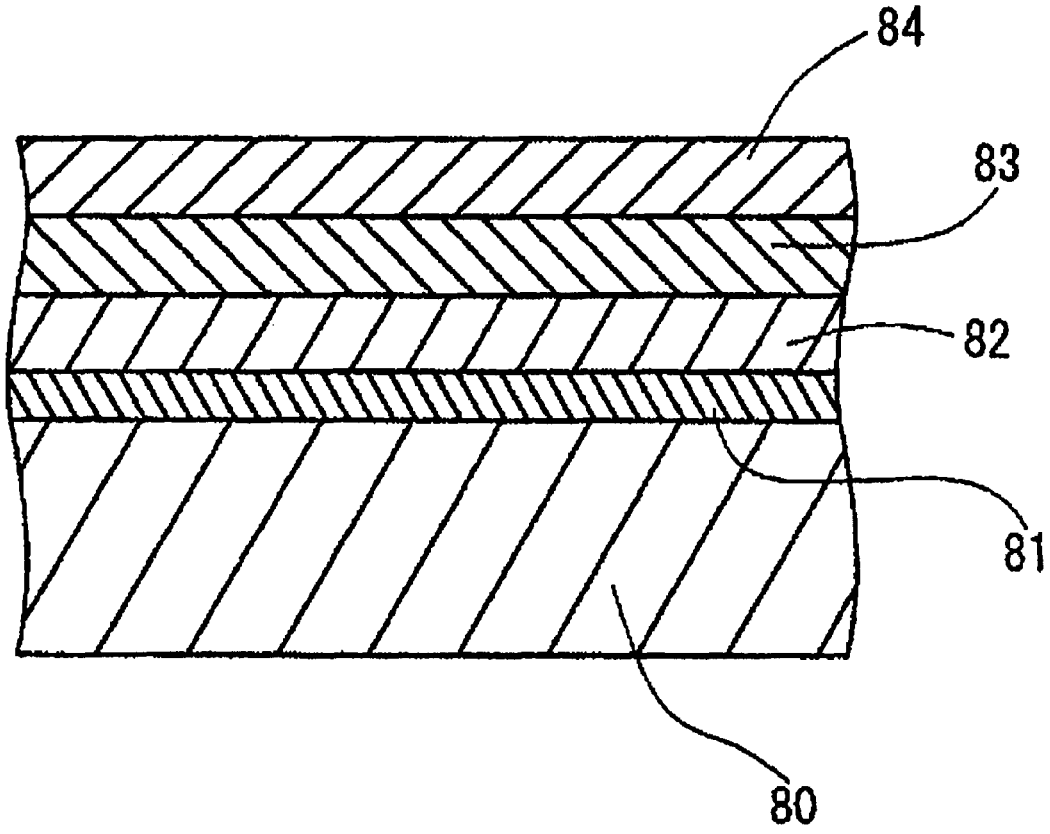
FIG. 4 is a sectional view showing a layer constitution of the reflector mirror of the present invention.

A reflector mirror as shown in FIG. 4 was produced in the process shown in FIG. 2 by using the thin film forming apparatus shown in FIG. 1, by forming the following layers successively in the order of (i) through (iv) on a glass substrate.

Glass Substrate (3 mm in Thickness)

(i) Dielectric layer 81: Lanthanum titanate $LaTiO_3$ (40 nm thick)

(ii) Reflection layer 82: Silver Ag (100 nm thick).

(iii) First transparent dielectric layer 83: Magnesium fluoride $MgF_2$ (73 nm thick).

(iv) Second transparent dielectric layer 84: Lanthanum titanate $La_2Ti_3O_8$ (60 nm thick).

The layers were formed under the following conditions.

(I) Dielectric Layer 81

Evaporation material 9: $LaTiO_3$ (purity 99%).

Gas introduced into the chamber 11: Argon gas and oxygen gas.

Power supplied from the high frequency power source 5 to the substrate holding section 2: 85 mW/cm$^2$ (power supplied per unit area of the substrate holding section 2) at frequency 13.56 MHz.

DC voltage source 6: Cathode connected to the substrate holding section 2 and anode connected to the boat 1.

Voltage applied by the DC voltage source 6 to the substrate holding section 2: 230 V.

Chamber 11: Electrically floated without grounding.

Rate of forming the $LaTiO_3$: 15 Å/second.

(A) Early Stage of Forming the $LaTiO_3$ Film (Period T2 Shown in FIG. 2)

Pressure in the chamber 11: Constant at $2\times10^{-2}$ Pa.

Current supplied from the heating power source 3 to the boat 1: 350 A (at end of period T2).

(B) $LaTiO_3$ Film Forming Period (Period T3 in FIG. 2)

Pressure in the chamber 11: Constant at $2\times10^{-2}$ Pa.

Current supplied from the heating power source 3 to the boat 1: 230 A (at end of period T3).

A $LaTiO_3$ film 40 nm in thickness could be formed on the surface of the substrate 80 under the conditions described above. The fact that the thermal seal having characteristic responding temperature at 40° C. or higher did not show response indicated that the substrate 80 was maintained at a temperatures below 40° C. throughout the entire period of forming the thin film.

(II) Reflection Layer 82

Evaporation material 9: silver (purity 99.9%).

Gas introduced into the chamber 11: Argon gas.

Power supplied from the high frequency power source 5 to the substrate holding section 2: 85 mW/cm$^2$ (power supplied per unit area of the substrate holding section 2) at frequency 13.56 MHz.

DC voltage source 6: Cathode connected to the substrate holding section 2 and anode connected to the boat 1.

Voltage applied by the DC voltage source 6 to the substrate holding section 2: 230 V.

Chamber 11: Electrically floated without grounding.

Rate of forming the silver layer: 18 Å/second.

(a) Early Stage of Forming the Silver Film (Period T2 Shown in FIG. 2)

Pressure in the chamber 11: Constant at $2\times10^{-2}$ Pa.
Current supplied from the heating power source 3 to the boat 1: 280 A (at end of period T2).
(b) Silver Layer Forming Period (Period T3 in FIG. 2)
Pressure in the chamber 11: Constant at $2\times10^{-2}$ Pa.
Current supplied from the heating power source 3 to the boat 1: Approx. 210 A (at end of period T3).

A silver layer 100 nm thick could be formed on the surface of the $LaTiO_3$ layer under the conditions described above. The fact that the thermal seal having characteristic responding temperature at 40° C. showed a slight response indicated that the substrate 80 was maintained at a temperature in a range from 40 to 45° C. throughout the entire period of forming the silver layer.

(III) First Transparent Dielectric Layer 83

Evaporation material 9: Magnesium fluoride $MgF_2$ (purity 99.9%).

Gas introduced into the chamber 11: Ar gas.

Power supplied from the high frequency power source 5 to the substrate holding section 2: 85 mW/cm$^2$ (power supplied per unit area of the substrate holding section 2) at frequency 13.56 MHz.

DC voltage source 6: Cathode connected to the substrate holding section 2 and anode connected to the boat 1.

Voltage applied by the DC voltage source 6 to the substrate holding section 2: 230 V.

Chamber 11: Electrically floated without grounding.

Rate of forming the $MgF_2$ layer: 15 Å/second.

(A) Early Stage of Forming $MgF_2$ Layer (Period T2 Shown in FIG. 2)
Pressure in the chamber 11: Constant at $2\times10^{-2}$ Pa.
Current supplied from the heating power source 3 to the boat 1: 350 A (at end of period T2).
(B) $MgF_2$ Layer Forming Period (Period T3 in FIG. 2)
Pressure in the chamber 11: Constant at $2\times10^{-2}$ Pa.
Current supplied from the heating power source 3 to the boat 1: 230 A (at end of period T3).

An $MgF_2$ layer 73 nm thick could be formed on the surface of the silver layer under the conditions described above. The fact that the thermal seal having characteristic responding temperature at 40° C. or higher did not show response indicated that the substrate 80 was maintained at a temperature below 40° C. throughout the entire period of forming the $MgF_2$ layer.

(IV) Second Transparent Dielectric Layer 84

$La_2Ti_3O_8$ layer was formed on the surface of the $MgF_2$ layer in the same manner as in the case of (I) except for using $La_2Ti_3O_8$ instead of $MgF_2$. The fact that the thermal seal having characteristic responding temperature at 40° C. or higher did not show response indicated that surface temperature of the substrate 80 was maintained at temperatures below 40° C. throughout the entire period of forming the $La_2Ti_3O_8$ layer.

The following evaluation tests were conducted on the reflector mirror obtained in Example 4.

1. Surface Roughness (1) Surfaces of the silver layer (reflection layer) formed as described above were observed with an atomic force microscope (Nano Scope II manufactured by Digital Instruments Inc.), to take an image of the surface irregularity with an accuracy on the order of nanometers and determine the arithmetic mean roughness (Ra). Value of Ra was about 1 nm for the silver layer of Example 4. Surfaces of the silver layer was measured immediately after forming the silver layer.

(2) Surfaces of the $La_2Ti_3O_8$ layer (second transparent dielectric layer 84), which is the top layer of the reflector mirror, was observed similarly to the above. As a result, the result of the arithmetic mean roughness (Ra) of the surface was about 2 nm.

2. (111) Peak Intensity of X-Ray Diffraction

An X-ray diffraction analyzer (RINT1400V type manufactured by Rigaku Denki Co.) was used to measure with X-ray output of 200 mA at 50 kV, measuring angle range 2θ from 10 to 100° and aperture of 1° for emission slit, 1° for scattering slit and 0.3 mm for receiving slit. The silver film of Example 4 showed a (111) peak intensity of X-ray diffraction of about 23 times the sum of all other peaks.

3. Reflectivity (1) Measurement of Reflectivity in Visible Light Region

Figure 23:
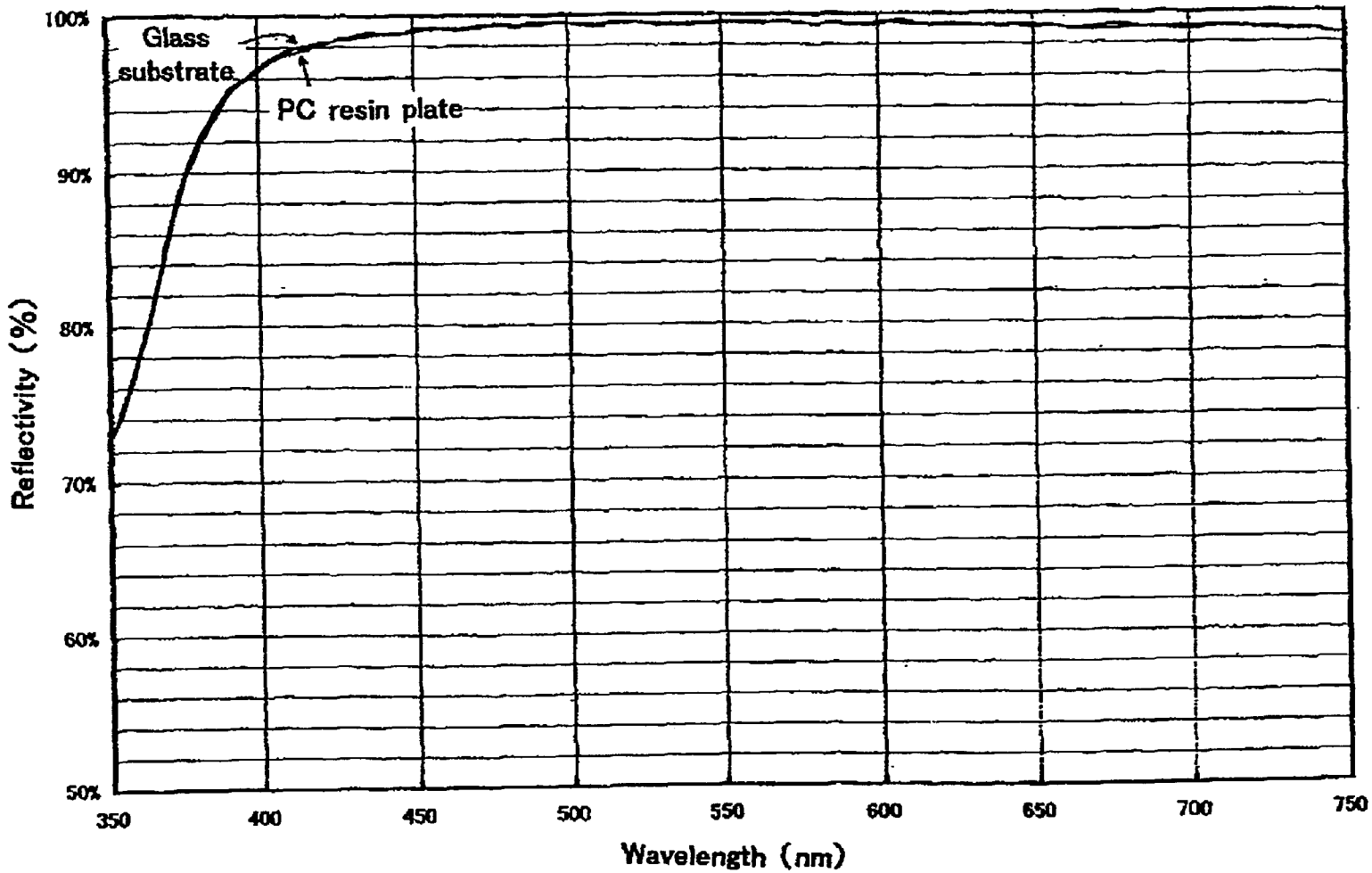
FIG. 23 is a graph showing the reflectivity characteristic of the reflector mirror of the present invention.

Reflectivity in the visible light region (wavelengths from about 350 to 750 nm) was measured with a photometer (spectrophotometer U-4000 manufactured by Hitachi Limited) The results are shown in FIG. 23. FIG. 23 shows that reflectivity of 98% or higher is achieved in the visible light region of wavelengths from 420 to 700 nm. FIG. 23 also shows the reflectivity of a reflector mirror produced in the same manner as in Example 4, except for using a polycarbonate (PC) resin plate instead of a glass substrate.

Figure 24:
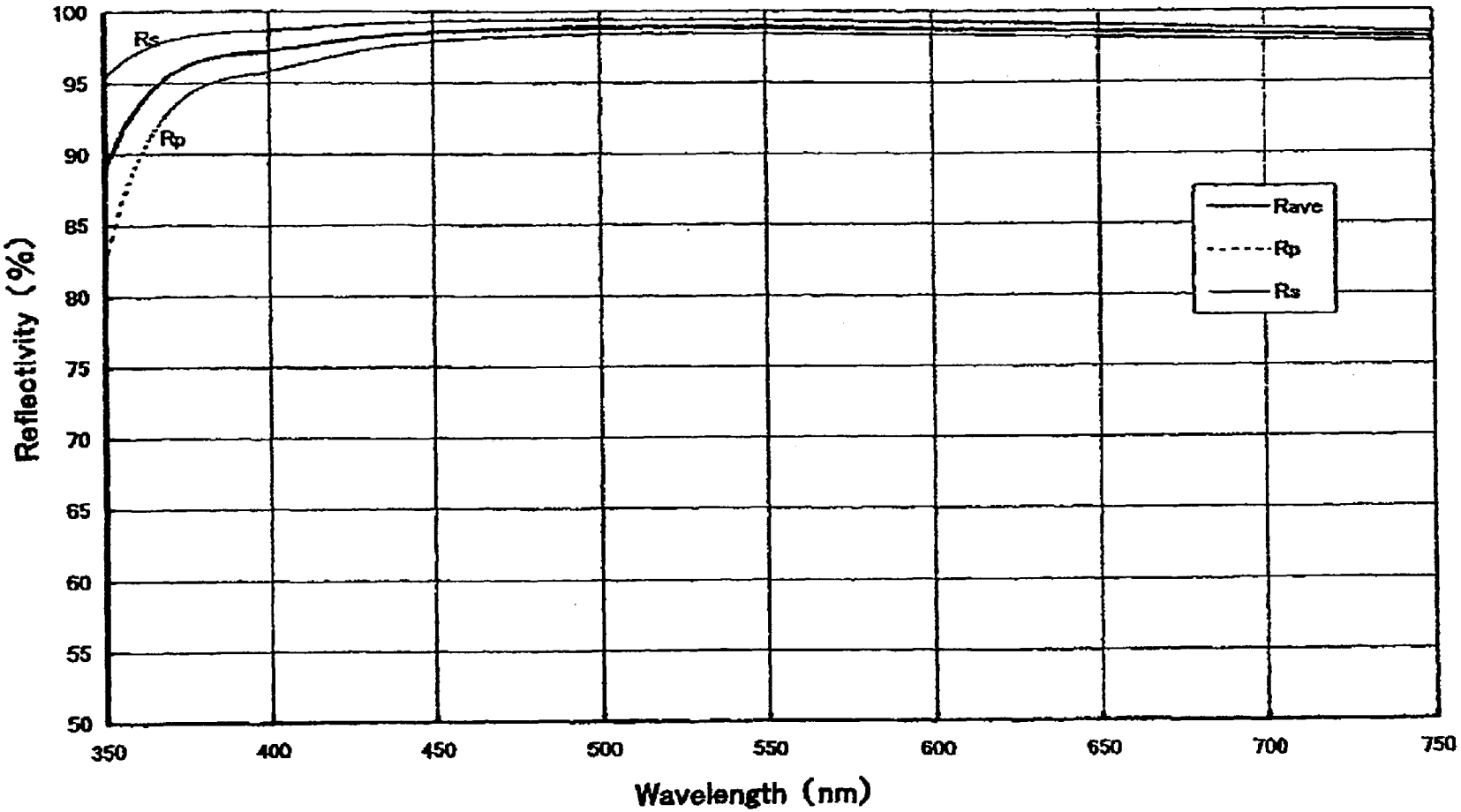
FIG. 24 is a graph showing the mean reflectivity of P polarization and S polarization, for incident light having wavelength in a range from 420 to 700 nm and incoming at an angle wavelength in a range from 420 to 700 nm and incoming at an angle of 45° or less.

(2) Reflectivities of P Polarization and S Polarization, and Mean Reflectivity Thereof Reflectivities $R_P$ and $R_S$ of P polarization and S polarization, and mean reflectivity $R_{ave}$ thereof for incident light having wavelength in a range from 350 to 750 nm and incoming at an angle of 45° were measured with the spectrophotometer U-4000. The results are shown in FIG. 24. FIG. 24 shows that mean reflectivity $R_{ave}$ of the reflectivities $R_P$ and $R_S$ of P polarization and S polarization is 98% or higher.

(3) Variations in Reflectivity

Variations in reflectivity were measured with the same photometer as that of the measurement (1) in a range of incident angles of light from 10 to 50°. Variations in reflectivity were in a range from 0.2 to 0.5% for the silver film of Example 4.

4. Corrosion Resistance

Silver is susceptible to sulfurization (blackening) under the influences of temperature and humidity, and can be quickly covered by a sulfide film in a hot and humid environment. Therefore, surface of the reflector mirror obtained in Example 4 was observed after the reflector mirror had been held at temperature of 50° C. and humidity of 95% for 24 hours according to MIL-M-13508. Corrosion did not occur on the surface of the reflector mirror including the silver layer.

In the salt water immersion test wherein the sample was immersed in 3% salt solution at 30° C. for 24 hours, peel-off of the silver layer was not observed. This is probably because there was no gap between the $LaTiO_3$ layer (dielectric layer 81) and the silver layer and between the silver layer and the $MgF_2$ layer (first transparent dielectric layer 83) and therefore salt solution did not infiltrate.

5. Bonding Performance

Bonding performance was examined by repetitive peel-off test using adhesive tape specified in MIL-M-13508. The silver layer of Example 4 showed durability to endure at least 100 cycles of peel-off. This is supposed to be due to the improvement in the bonding performance that is achieved by interposing the $LaTiO_3$ layer (dielectric layer 81) between the glass substrate and the silver layer.

Reflector mirrors having characteristics similar to those of Example 4 were obtained in all cases of using $La_2Ti_3O_8$, $SiO_2$, $TiO_2$, or $Al_2O_3$ as the dielectric layer 81, using $SiO_2$ as the first transparent dielectric layer 83, and using $LaTiO_3$, $SiO_2$, $TiO_2$, or $Al_2O_3$ as the second transparent dielectric layer 84.

What is claimed is:

[1. A metal film wherein an arithmetic mean roughness of the surface is not larger than 2 nm and a (111) peak intensity of X-ray diffraction is not less than 20 times the sum of other peaks.]

[2. The metal film according to claim 1, wherein a difference in the reflectivity from a theoretical value of a pure metal is 0.2% or less in a visible light region.]

[3. The metal film according to claim 2, wherein variations in the reflectivity is 0.5% or less in a range of incident angles of light from 10 to 50°.]

[4. The metal film according to claim 1, wherein a difference in the reflectivity from a theoretical value of a pure metal is 0.2% or less in a range of wavelengths of light from 250 to 400 nm.]

[5. The metal film according to claim 1, which is made of at least a metal selected from the group consisting of Ag, Cu, Au, Pt, Al, Ti, Cr, Ni, Fe, W, and Zn.]

[6. A metal film-coated member comprising a substrate and the metal film of any one of claims 1 to 5 formed on the substrate.]

[7. The metal film-coated member according to claim 6, wherein an anti-reflection film comprising a plurality of dielectric material layers is formed on the surface of the metal film.]

[8. The metal film-coated member according to claim 6, wherein the substrate is made of glass, ceramics, semiconductor material, metallic material or plastic.]

[9. A metal formed by a thin film forming method of depositing a material of a thin film turned into plasma on the surface of a substrate that is maintained at a temperature not higher than 100° C., wherein an arithmetic mean roughness of the surface is 2 nm or less and a (111) peak intensity of X-ray diffraction is not less than 20 times the sum of other peaks.]

[10. The metal film according to claim 9, which is formed in the condition that a temperature of the substrate is not higher than 80° C.]

[11. The metal film according to claim 9, wherein a difference in the reflectivity from a theoretical value of a pure metal is 0.2% or less in a visible light region.]

[12. The metal film according to claim 11, wherein variations in the reflectivity is within 0.5% in a range of incident angles of light from 10 to 50°.]

[13. The metal according to claim 9, wherein a difference in the reflectivity from a theoretical value of a pure metal is 0.2% or less in a range of wavelengths of light from 250 to 400 nm.]

[14. The metal film according to claim 9, which is made of at least a metal selected from the group consisting of Ag, Cu, Au, Pt, Al, Ti, Cr, Ni, Fe, W, and Zn.]

[15. An optical coating film comprising a metal film that has an arithmetic mean roughness of the surface being 2 nm or less and a (111) peak intensity of X-ray diffraction not less than 20 times the sum of other peaks, wherein a difference in the reflectivity from the theoretical value of the pure metal is 0.2% or less in the visible light region.]

[16. The optical coating film according to claim 15, wherein variations in the reflectivity is 0.5% or less in a range of incident angles of light from 10 to 50°.]

[17. An optical coating film comprising a metal film that has an arithmetic mean roughness of the surface being 2 nm or less and a (111) peak intensity of X-ray diffraction not less than 20 times the sum of other peaks, wherein a difference in the reflectivity from the theoretical value of the pure metal is 0.2% or less in a range of wavelengths of light from 250 to 400 nm.]

[18. The optical coating film according to claim 15 or 17, wherein the metal film is made of silver or aluminum.]

19. A reflector mirror comprising, as a reflection layer, a silver film which has an arithmetic mean roughness of the surface being 3 nm or less and a (111) peak intensity of X-ray diffraction not less than 20 times the sum of other peaks.

20. An image projector apparatus, wherein the reflector mirror of claim 19 is provided.

21. The image projector according to claim 20, comprising a light source, a color separator for separating light from the light source into a plurality of chromatic lights, a light modulator for modulating each chromatic light separated by the color separator, a chromatic light synthesizer that synthesizes each chromatic light modulated by the light modulator to form image light, and a projection lens that projects the light image from the chromatic light synthesizer onto a screen, wherein the reflector mirror is disposed in the optical path from the light source to the projection lens.

22. A Si film wherein an arithmetic mean roughness of the surface is not larger than 2 nm and a (111) peak intensity of X-ray diffraction is not less than 20 times the sum of other peaks.

23. A Si film-coated member comprising a substrate and the Si film of claim 22 formed on the substrate.

24. The Si film-coated member according to claim 23, wherein an anti-reflection film comprising a plurality of dielectric material layers is formed on the surface of the Si film.

25. The Si film-coated member according to claim 23, wherein the substrate is made of glass, ceramics, semiconductor material, metallic material or plastic.

[26. Si formed by a thin film forming method of depositing a material of a thin film turned into plasma on the surface of a substrate that is maintained at a temperature not higher than 100° C., wherein an arithmetic mean roughness of the surface is 2 nm or less and a (111) peak intensity of X-ray diffraction is not less than 20 times the sum of other peaks.]

* * * * *